(12) United States Patent  (10) Patent No.: US 8,803,326 B2
Liu et al.  (45) Date of Patent: Aug. 12, 2014

(54) CHIP PACKAGE

(71) Applicant: Xintec Inc., Jhongli (TW)

(72) Inventors: Tsang-Yu Liu, Zhubei (TW); Chia-Ming Cheng, New Taipei (TW)

(*) Notice: Subject to any disclaimer, the term of this patent is extended or adjusted under 35 U.S.C. 154(b) by 0 days.

(21) Appl. No.: 13/678,507

(22) Filed: Nov. 15, 2012

(65) Prior Publication Data

US 2013/0119556 A1  May 16, 2013

Related U.S. Application Data

(60) Provisional application No. 61/559,868, filed on Nov. 15, 2011.

(51) Int. Cl.
*H01L 23/48* (2006.01)
*H01L 23/52* (2006.01)
*H01L 29/40* (2006.01)

(52) U.S. Cl.
USPC ............................................. 257/774

(58) Field of Classification Search
USPC .......... 257/774, 737, 738, E23.021, E23.069, 257/41, 81, 82, 91, 99, 100, 116, 432–437, 257/749, E33.056–E33.059, 186, E31.005, 257/667, 787–796, E31.117–E31.118, 257/E51.02, E23.116–E23.14, 171, 626, 257/632–651, 668, 671, 685, 686, 723, 726, 257/E25.031–E25.032, E23.042; 438/613–617, 25–28
See application file for complete search history.

(56) References Cited

U.S. PATENT DOCUMENTS

2006/0141750 A1* 6/2006 Suzuki et al. ................. 438/460
2010/0314727 A1* 12/2010 Uchida et al. ................. 257/659
2012/0068292 A1* 3/2012 Ikeda et al. ................... 257/432

* cited by examiner

*Primary Examiner* — Dao H Nguyen
*Assistant Examiner* — Tram H Nguyen
(74) *Attorney, Agent, or Firm* — Liu & Liu

(57) ABSTRACT

A chip package includes: a substrate having a first surface, a second surface, and a side surface connecting the first and the second surfaces; a dielectric layer located on the first surface; conducting pads comprising a first and a second conducting pads located in the dielectric layer; openings extending from the second surface towards the first surface and correspondingly exposing the conducting pads, wherein a first opening of the openings and a second opening of the openings next to the first opening respectively expose the first and the second conducting pads and extend along a direction intersecting the side surface of the substrate to respectively extend beyond the first and the second conducting pads; and a first and a second wire layers located on the second surface and extending into the first the second openings to electrically contact with the first and the second conducting pads, respectively.

22 Claims, 46 Drawing Sheets

CHIP PACKAGE

CROSS REFERENCE TO RELATED APPLICATIONS

This application claims the benefit of U.S. Provisional Application No. 61/559,868, filed on Nov. 15, 2011, the entirety of which is incorporated by reference herein.

BACKGROUND OF THE INVENTION

1. Field of the Invention

The invention relates to a chip package, and in particular relates to a chip package formed by a wafer level packaging process.

2. Description of the Related Art

A fabrication process of chip packages is one important step of forming electronic products. A chip package not only provides protection for the chips from environmental contaminants, but also provides a connection interface for chips packaged therein.

Because the size of the chip shrinks and the number of pads increases, it is more difficult to form wires electrically connected to the pads in the chip package. Thus, it is desired to have an improved chip packaging technique.

BRIEF SUMMARY OF THE INVENTION

An embodiment of the invention provides a chip package which includes: a substrate having a first surface and an opposite second surface and a side surface connecting the first surface and the second surface; a dielectric layer located on the first surface of the substrate; a plurality of conducting pads at least comprising a first conducting pad and a second conducting pad located in the dielectric layer; a plurality of openings extending from the second surface towards the first surface of the substrate and correspondingly exposing the conducting pads, wherein a first opening of the openings and a second opening of the openings next to the first opening respectively expose the first conducting pad and the second conducting pad and extend along a direction intersecting the side surface of the substrate to respectively extend beyond the first conducting pad and the second conducting pad; and a first wire layer and a second wire layer located on the second surface of the substrate and extending into the first opening and the second opening to electrically contact with the first conducting pad and the second conducting pad, respectively.

An embodiment of the invention provides a chip package which includes: a substrate have a first surface, an opposite second surface, and a side surface extending between the first surface and the second surface; a plurality of conducting pads disposed above the first surface; a plurality of open channels defined on the side surface, extending from the second surface to the first surface and exposing the conducting pads at the first surface; and a wire layer disposed above the second surface and extending into the open channels to electrically contact the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

Figure 1A:
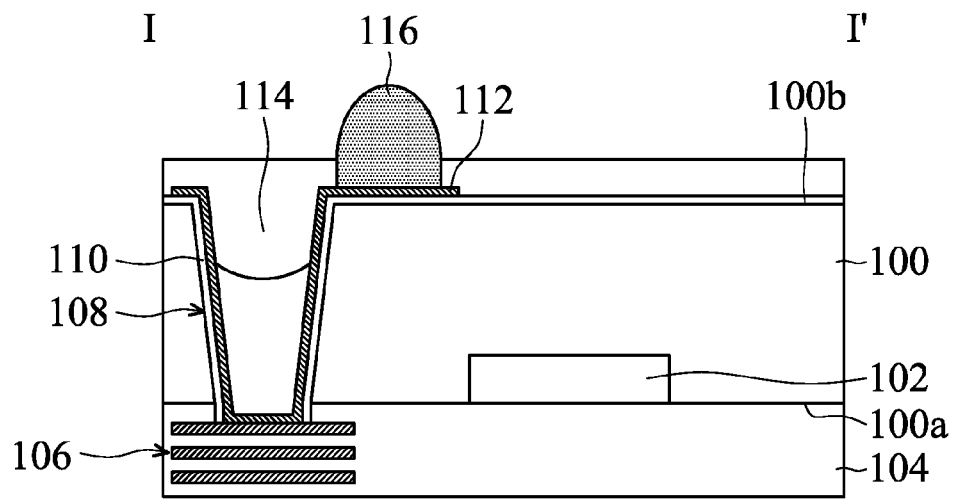
FIG. 1A is a cross-sectional view showing a chip package known by the inventor of the application.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a MOSFET chip such as a power module chip. However, embodiments of the invention are not limited thereto. For example, the chip package of the embodiments of the invention may be applied to package active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

Figure 1B:
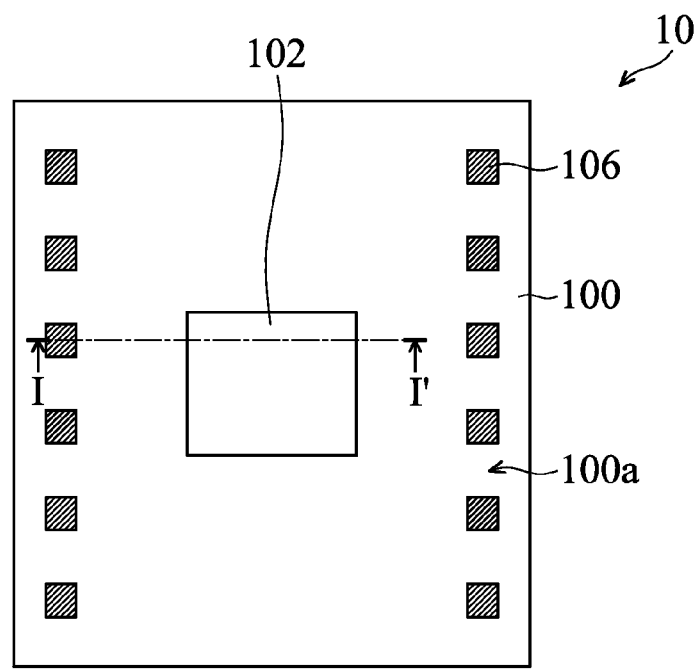
FIG. 1B is a plane view showing a chip known by the inventor of the application.

FIG. 1A is a cross-sectional view showing a chip package known by the inventor of the application, and FIG. 1B is a plane view showing a chip 10 known by the inventor of the application, which are used to illustrate problems discovered by the inventor. FIG. 1A is a cross-sectional view taken along the line I-I' of FIG. 1B.

As shown in FIG. 1B, the packaged chip 10 includes a substrate 100. A device region 102 is formed in the substrate 100. A plurality of conducting pads 106 are disposed on a surface 100a of the substrate 100, which are electrically connected to elements in the device region 102, respectively. The conducting pads 106 may be disposed on a periphery region of the substrate 100. As shown in the cross-sectional view in FIG. 1A, the conducting pads 106 may be formed in a dielectric layer 104 formed on the surface 100a of the substrate 100. In addition, a plurality of holes 108 extending from a surface 100b towards the surface 100a of the substrate 100 may be formed in the substrate 100. The holes 108 may expose the corresponding conducting pads 106 thereunder, respectively.

As shown in FIG. 1A, an insulating layer 110 may be formed on the surface 100b of the substrate 100, which may extend onto a sidewall of the hole 108. A plurality of wire layers 112 may be formed on the insulating layer 110 and extend into the holes 108 to electrically contact with the conducting pads 106, respectively and correspondingly. The wire layers 112 may further be electrically connected to conducting bumps 116 penetrating a protection layer 114.

However, with elements in the device region 102 in the chip 10 are getting denser, the number of the required conducting pads 106 accordingly increases. In addition, with the size of the chip 10 is getting smaller, area of each of the conducting pads 106 accordingly shrinks. The formed holes 108 exposing the conducting pads 106 also need to be shrunk. Thus, the inventor of the application thinks that problems about patterning process will be encountered when the hole 108 is shrunk to be a specific level. In addition, because the aspect ratio of the hole 108 increases, it is also getting more difficult to form a material layer (such as the insulating layer 110 and the conducting layer 112) in the hole 108. Thus, in order to resolve and/or reduce the problems might be encountered mentioned above, an improved chip packaging technique is provided by the inventor. Thereafter, embodiments of the invention are illustrated with reference to the accompanying drawings to introduce the chip packaging technique of the invention.

Figure 2A:
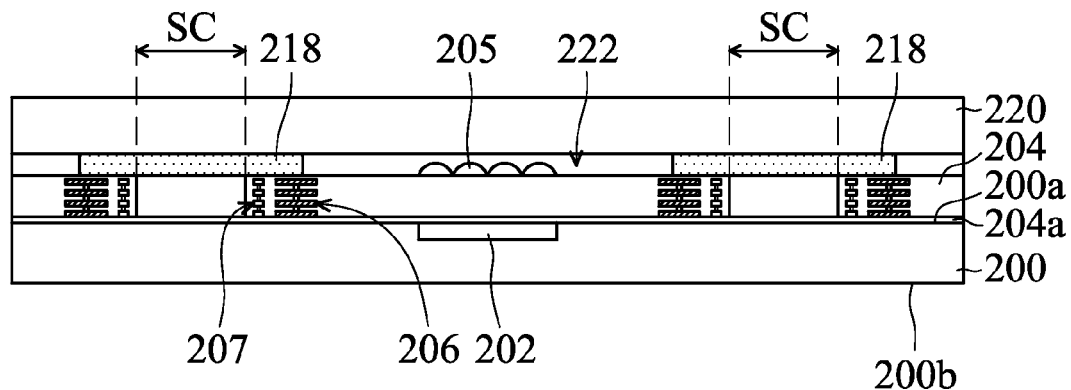
FIGS. 2A-2F are cross-sectional views showing the steps of forming a chip package according to an embodiment of the present invention.
Figure 2B:
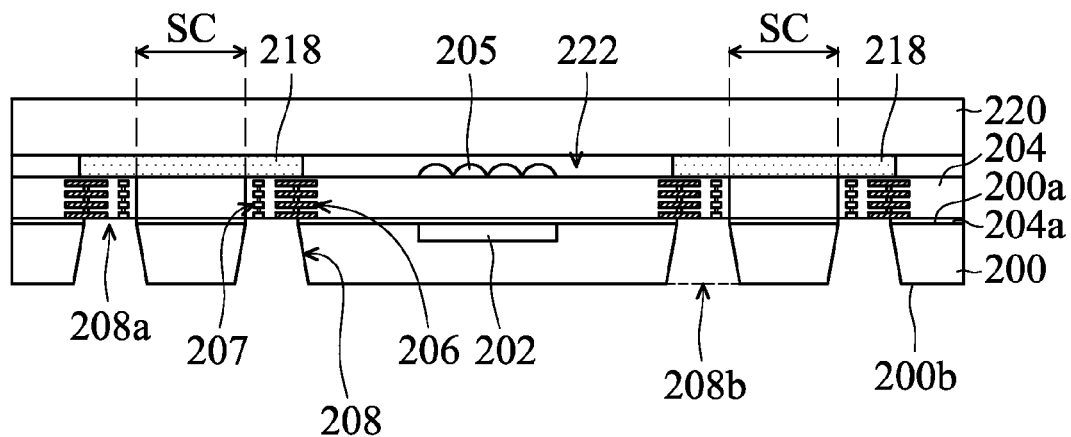
Figure 2C:
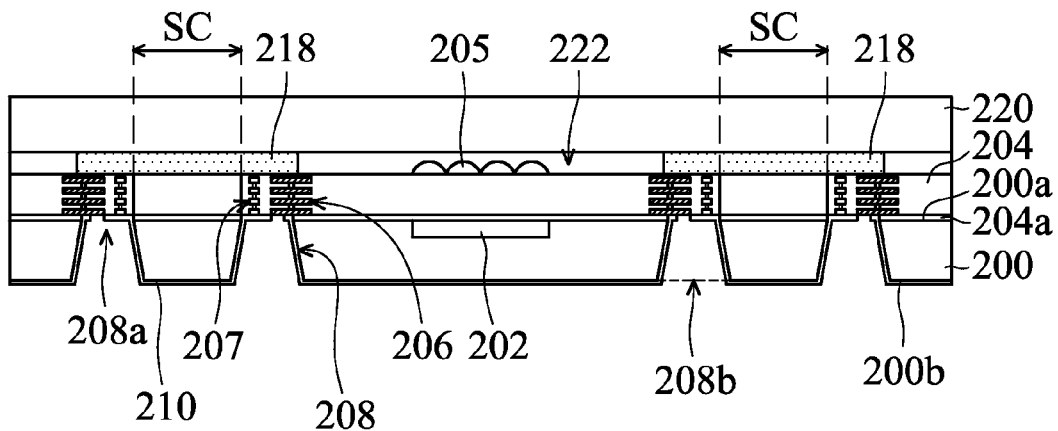
Figure 2D:
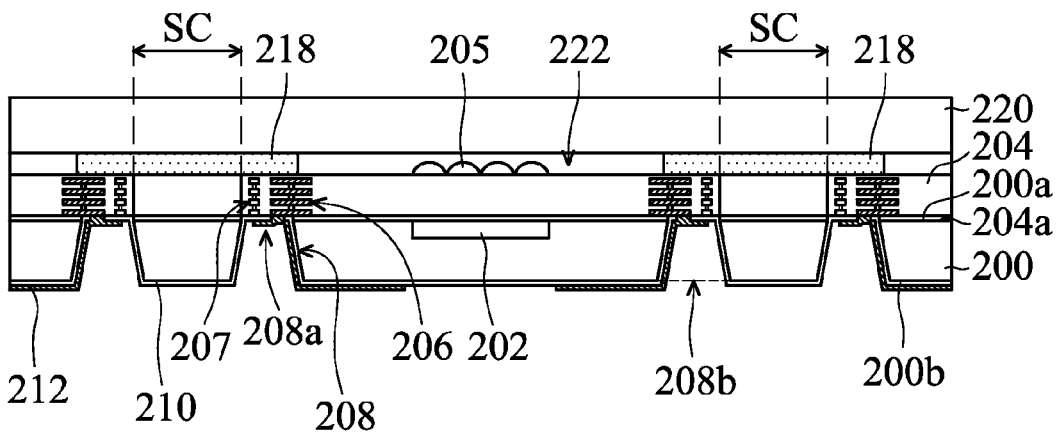
Figure 2E:
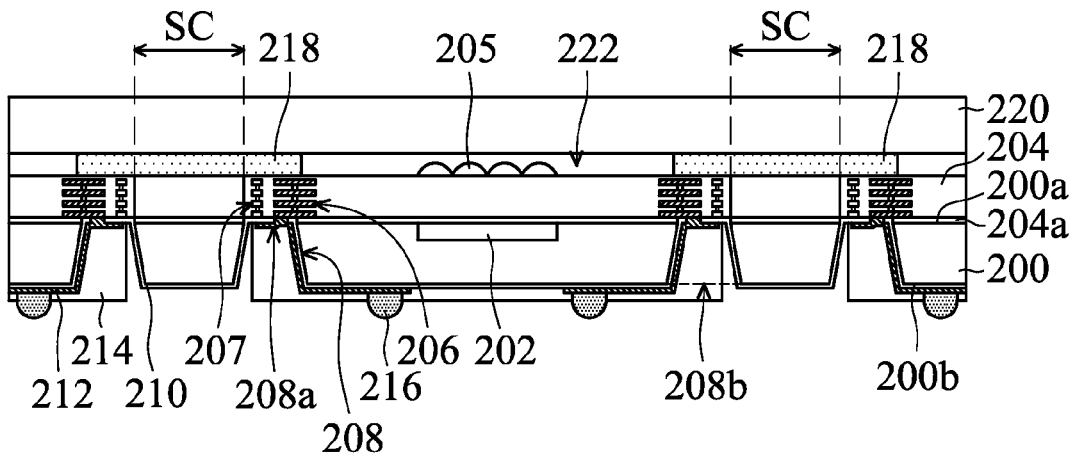
Figure 2F:
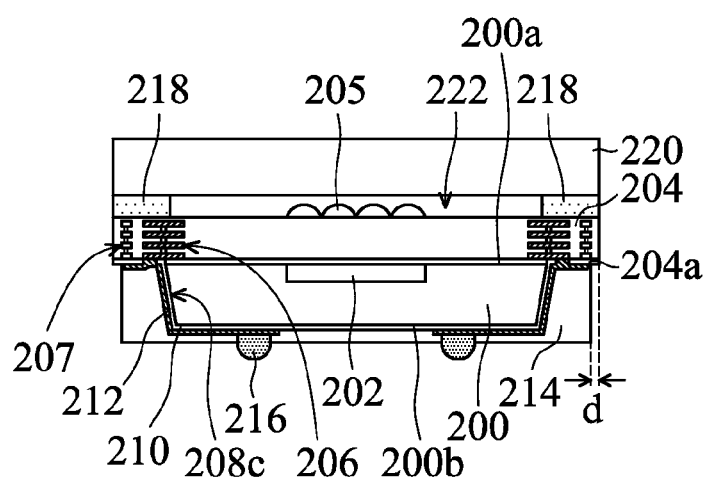
Figure 3A:
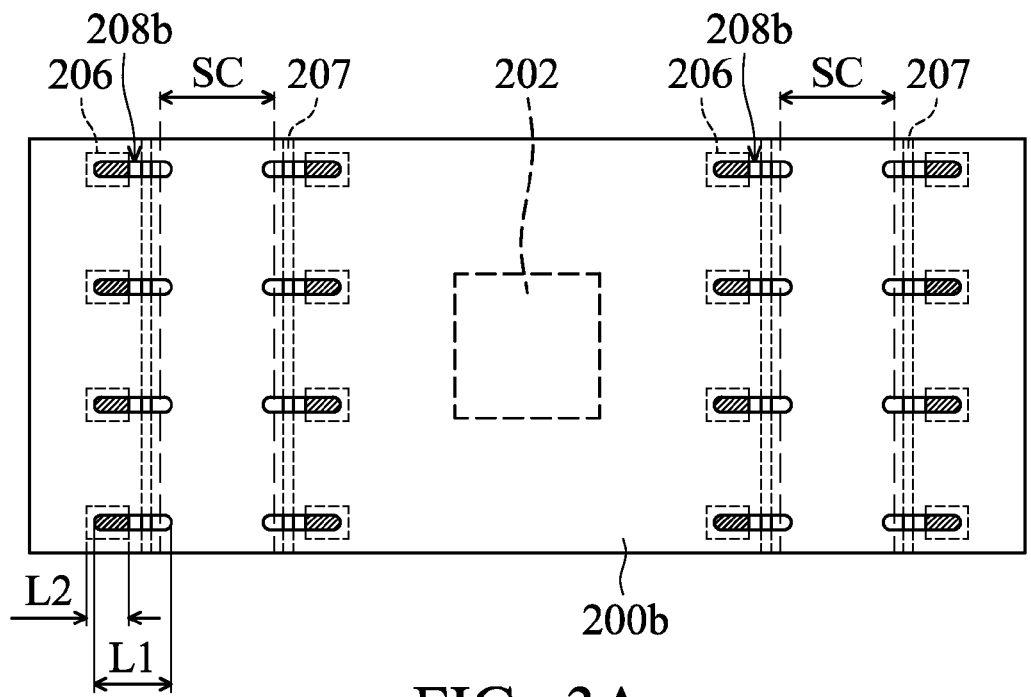
FIGS. 3A and 3C are plane views respectively showing the structure in FIG. 2B, which are respectively observed from opposite two surfaces of the substrate.
Figure 3B:
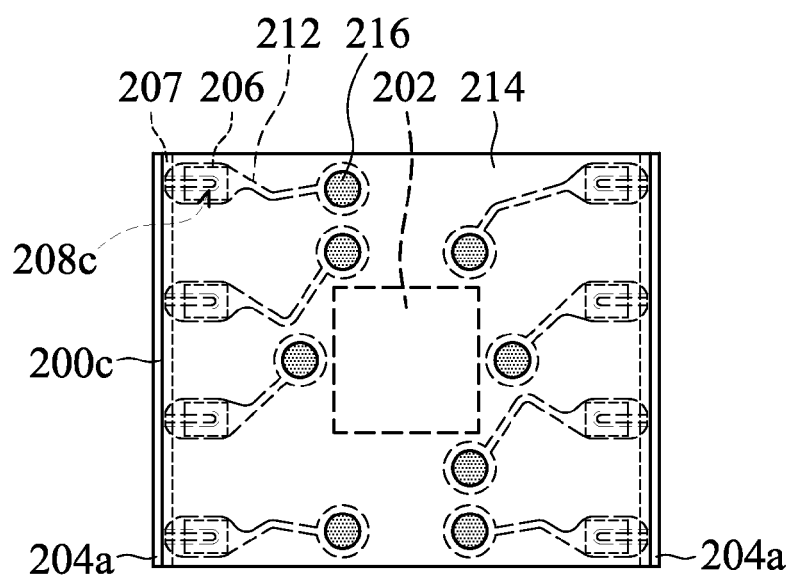
FIG. 3B is a plane view corresponding to the structure shown in FIG. 2F.
Figure 3C:
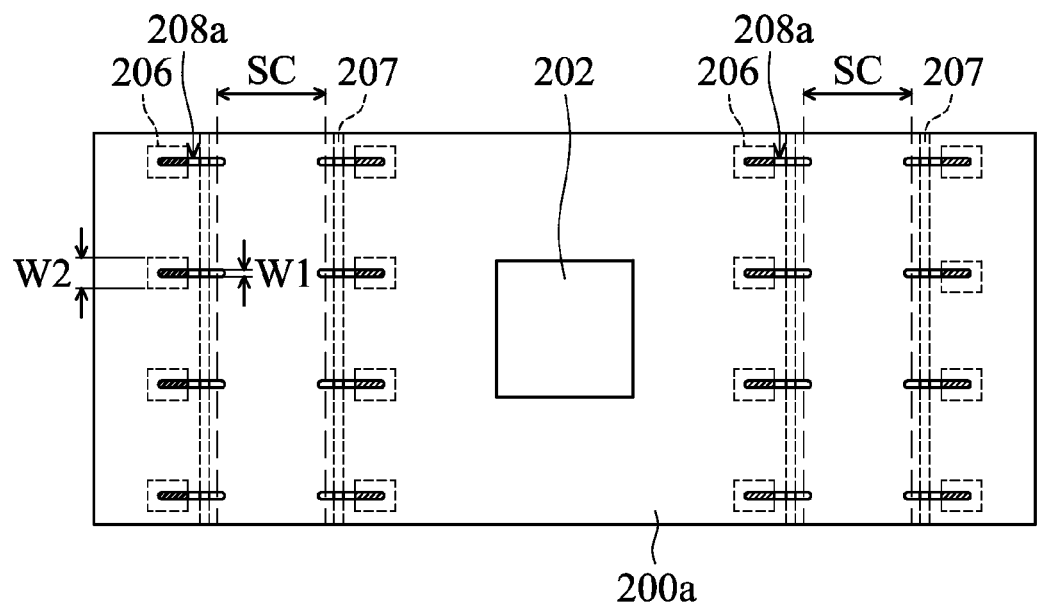
Figure 4A:
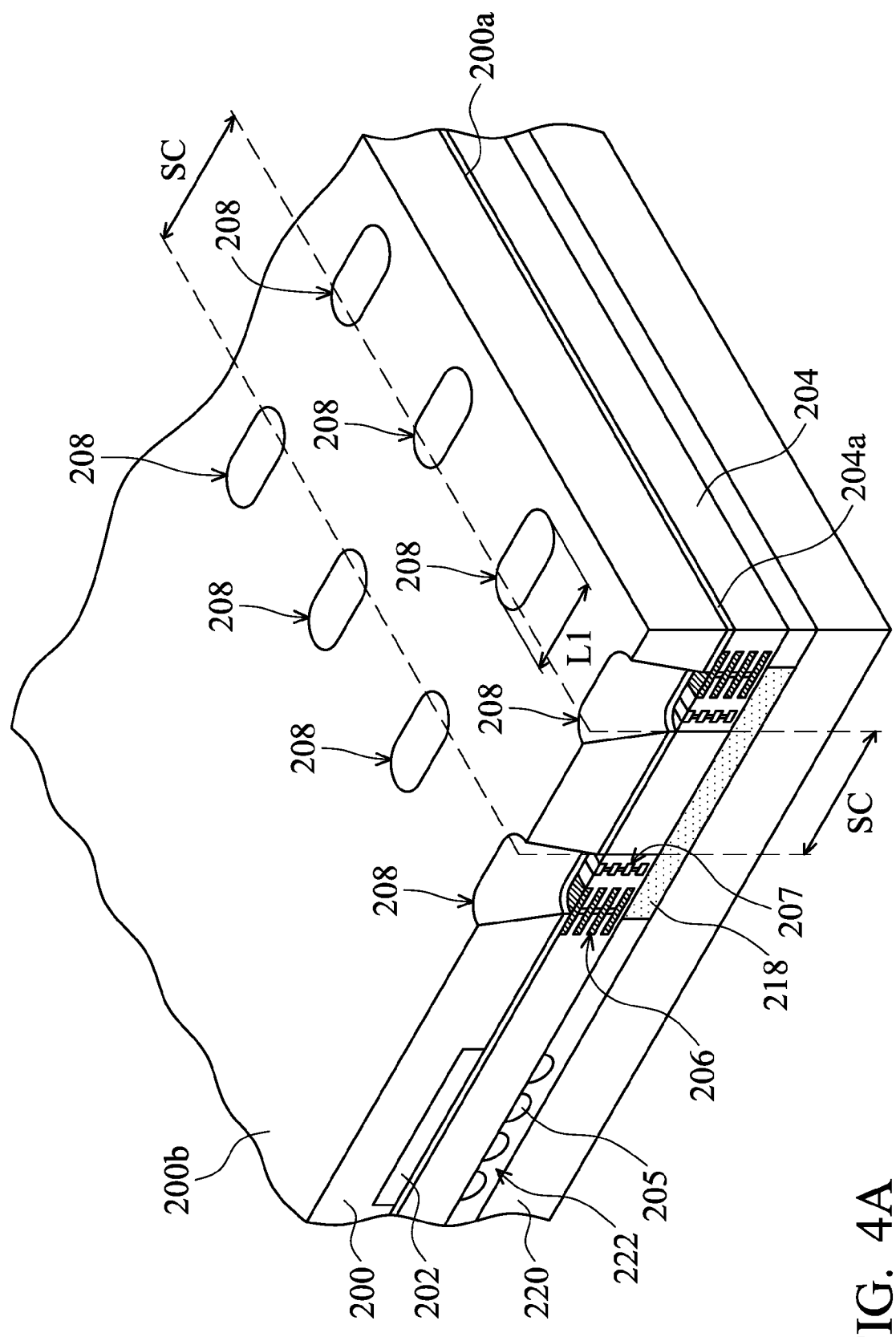
FIGS. 4A-4C are three-dimensional views showing the steps of forming a chip package according to an embodiment of the present invention.
Figure 4B:
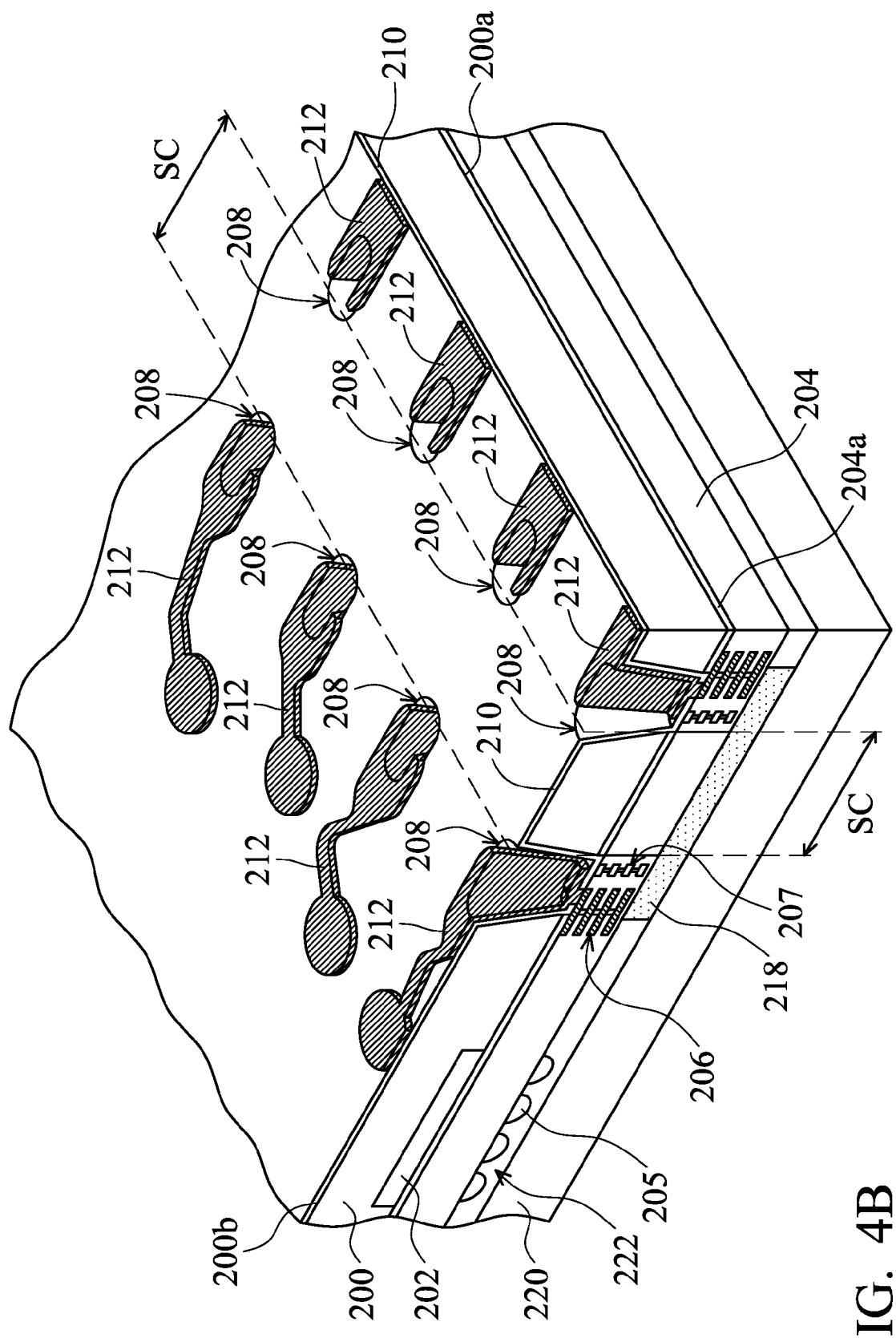
Figure 4C:
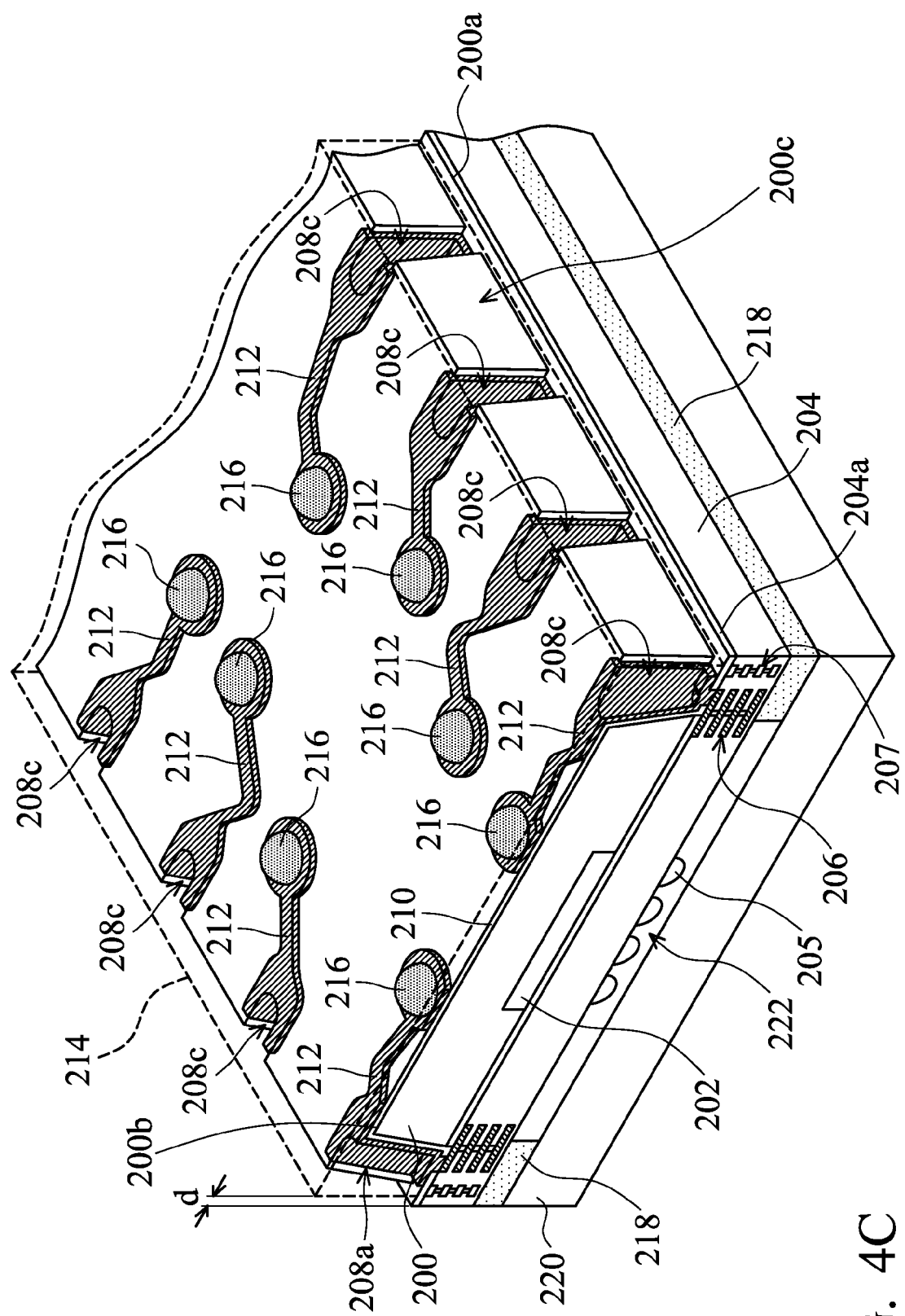

FIGS. 2A-2F are cross-sectional views showing the steps of forming a chip package according to an embodiment of the present invention. FIG. 3A is a plane view corresponding to the structure in FIG. 2B (observed from the surface 200b). FIG. 3B is a plane view corresponding to the structure shown in FIG. 2F, and FIG. 3C is a plane view corresponding to the structure in FIG. 2B (observed from the surface 200a). FIGS. 4A-4C are three-dimensional views showing the steps of forming a chip package according to an embodiment of the present invention, which may correspond to the embodiment shown in FIGS. 2A-2F. In FIGS. 2-4, same or similar reference numbers are used to designate same or similar elements.

In one embodiment, the process steps of a chip package includes a front-end chip (wafer) process step and a back-end package process step. Through front-end semiconductor processes such as deposition, etching, and development, a variety of integrated circuits may be formed on a wafer. Then, a back-end wafer-level packaging process may be performed to the wafer having integrated circuits formed thereon, followed by a dicing process step to form a plurality of separate chip scale packages.

As shown in FIG. 2A, in the front-end chip process step, a substrate 200 is first provided, which has a surface 200a and a surface 200b. The substrate 200 is, for example, a semiconductor substrate. In one embodiment, the substrate 200 is a semiconductor wafer (such as a silicon wafer). The substrate 200 may be defined into a plurality of die regions by a plurality of predetermined scribe lines SC.

A plurality of device regions 202 may be formed or disposed in the substrate 200. In one embodiment, each of the die regions of the substrate 200 defined by the predetermined scribe lines SC has at least one device region 202, and there are a plurality of periphery regions respectively and correspondingly surround the device regions 202. The device region 202 may include active or passive devices, or electronic components with digital or analog circuits, such as opto electronic devices, micro electro mechanical systems (MEMS), micro fluidic systems, and physical sensors for detecting heat, light, or pressure, or power MOSFET modules. In the embodiment shown in FIG. 2, the device region 202 may include an optoelectronic device such as an image sensor device or a light emitting device.

As shown in FIG. 2A, at least a dielectric layer may be formed on the surface of the substrate for the use of insulating and covering, which may includes, for example, a dielectric layer 204a and a dielectric layer 204. A plurality of conducting pads 206 may be formed between the dielectric layer 204 and the substrate 200. The conducting pads 206 may be disposed on, for example, periphery regions of the substrate 200 and be arranged along positions near the predetermined scribe lines SC. The conducting pad 206 may be electrically connected to elements in the device region 202 through an interconnection structure (not shown). In one embodiment, each of the conducting pads 206 may include a stacked structure of a plurality of conducting layers formed in the dielectric layer 204. The stacked conducting layers may be electrically connected to each other through, for example, a metal interconnection structure (not shown).

In one embodiment, the conducting pad 206 is an original conducting pad formed in the dielectric layer 204 in the front-end chip process step and is separated from an edge of the scribe line SC by a predetermined distance. That is, in this embodiment, no extension conducting pad extending to the edge of the scribe line SC or on the scribe line SC needs to be additionally formed. Because all of the conducting pads 206 do not extend into the predetermined scribe lines SC, contact with test structures disposed on the predetermined scribe lines SC may be prevented.

In one embodiment, a plurality of continuous seal ring structures 207 or a plurality of discontinuous seal ring structures 207 may be formed in the dielectric layer 204, which may be respectively disposed on the periphery regions of the die regions of the substrate 200 (or outside regions of the periphery regions) and surround a portion of the periphery region and the device region 202 therein. In one embodiment, the seal ring structures 207 and the conducting pads 206 may be simultaneously defined and formed. Thus, the seal ring structures 207 and the conducting pads 206 may be substantially the same conducting structures. In addition, the seal ring structure 207 may be disposed on a region outside of the conducting pad 206 or on a region surrounded by two adjacent conducting pads 206 and the edge of the scribe line SC. Thus, when a subsequent dicing process is performed along the predetermined scribe lines, the seal ring structure 207 may protect surrounded devices or circuits structures of the die from being damaged due to stress generated by the dicing process.

After the front-end chip process step is accomplished, a back-end packaging process step may then be performed to the wafer with the integrated circuits formed therein. For optical chips, some auxiliary optical elements may first be disposed. As shown in FIG. 2A, in one embodiment, microlenses 205 may be disposed on the device regions 202, respectively. The microlens 205 may include a microlens array. The microlens 205 may be used to help light to enter the device region 202 or lead out light emitted from the device region 202. In one embodiment, a color filter plate (not shown) may be optionally disposed on the microlens 205. The color filter plate may be disposed, for example, between the microlens 205 and the device region 202.

Then, a cover layer 220 may be optionally disposed on the surface 200a of the substrate 200. The cover layer 220 may be a substrate such as a glass substrate, quartz substrate, transparent polymer substrate, or combinations thereof. In one embodiment, a spacer layer 218 may be disposed between the cover layer 220 and the substrate 200. The spacer layer 218 may be optionally disposed to partially or completely cover the conducting pad 206 and may further extend across over the predetermined scribe line SC. The material of the spacer layer 218 may be, for example, a photosensitive polymer material and may be defined and formed through an exposure process and a development process. The spacer layer 218, the cover layer 220 and the substrate 200 may define a substantially closed cavity 222 on the device region 202. The cavity 222 may contain the microlens 205. In one embodiment, the spacer layer 218 may be first formed on the cover layer 220, followed by being bonded onto the dielectric layer 204 on the substrate 200. In one embodiment, the spacer layer 218 still has stickiness and may be directly bonded on the substrate 200. In one embodiment, after the spacer layer 218 is bonded to the substrate 200, a curing process may be performed to the spacer layer 218. For example, the spacer layer 218 may be heated. Alternatively, the spacer layer 218 may be bonded onto the substrate 200 through an adhesive (not shown). In another embodiment, the spacer layer 218 may also be first formed on the substrate 200, and the spacer layer 218 and the cover layer 220 are then bonded.

Then, the substrate 200 may be optionally thinned. For example, the cover layer 220 may be used as a support substrate, and a thinning process (such as a mechanical grinding process or a chemical mechanical polishing process) may be performed to the surface 200b of the substrate 200 to thin down the substrate 200 to an appropriate thickness.

Next, as shown in FIG. 2B, through a photolithography process and an etching process, a portion of the substrate 200 may be removed from the surface 200b of the substrate 200 to form a plurality of openings 208 extending towards the surface 200a. In addition, a portion of the dielectric layer 204a may be further removed to expose the conducting pads 206. In one embodiment, the openings 208 may expose the corresponding conducting pads 206 and the seal ring structures 207, respectively. A sidewall of the opening 208 may incline to the surface 200a of the substrate 200 or be substantially perpendicular to the surface 200a of the substrate 200. In one embodiment, a width of the opening 208 gradually increases along a direction extending from a lower opening end 208b of the opening 208 near the surface 200b towards an upper opening end 208a of the opening 208 near the conducting pad 206 or the surface 200a.

FIGS. 3A and 4A are a plane view and a three-dimensional view showing the structure corresponding to that shown in FIG. 2B, respectively. As shown in FIGS. 3A and 4A, in one embodiment, at least a portion or all of the opening 208 such as a long portion having a length L1 of the lower opening end 208b laterally extends into the predetermined scribe line SC. Alternatively, the length L1 of the long portion of the lower opening end 208b may be set to be larger than a length L2 of the conducting pad 206. Thus, the width of the lower opening end 208b of the opening 208 may be enlarged to effectively reduce the aspect ratio of the opening 208 such that a material layer subsequently formed in the opening 208 may be smoothly deposited. The more the opening 208 extends towards or into the scribe line SC, the more easily the process of subsequent material layer deposition in the opening 208 proceeds. In another embodiment, as shown in FIG. 3C, as shown in FIG. 3C, at least a portion or all of the opening 208 such as a wide portion of the upper opening end 208a is located within an area occupied by the conducting pad 206. That is, at least the width W1 of the wide portion of the upper opening end 208a is set to be less or equal to a width W2 of the conducting pad 206. Thus, in addition to a substrate region, facing the scribe line SC, of an area surrounding the conducting pad 206, another substrate region such as a region between two adjacent conducting pads 206 may be disposed with some functional circuit structures to increase available area for forming circuit of the substrate. In other words, in one embodiment, a projection of at least a portion or all of the opening 208 such as the wide portion of the upper opening end 208a on the upper surface 200a of the substrate 200 is within a projection area of the conducting pad 206 on the upper surface 200a of the substrate 200.

Next, as shown in FIG. 2C, an insulating layer 210 may be formed on the surface 200b of the substrate 200, which may extend into the openings 208. The insulating layer 210 may include, for example, an oxide, nitride, oxynitride, polymer material, or combinations thereof. The insulating layer 210 may be formed by using a chemical vapor deposition process, physical vapor deposition process, thermal oxidation process, or coating process. Then, by using a photolithography process and an etching process, a portion of the insulating layer 210 located at the upper opening end 208a of the opening 208 may be removed to expose the conducting pad 206. In another embodiment, a photoresist material is adopted to form the insulating layer 210. Thus, an exposure process and a development process may be performed to the insulating layer 210 to pattern the insulating layer 210 such that the conducting pads 206 are exposed. In one embodiment, it is preferable that the insulating layer 210 still completely covers the seal ring structures 207 to prevent subsequently formed wire layers from contacting with the seal ring structures 207 and causing a short circuiting.

As shown in FIG. 2D, a plurality of wire layers 212 are then formed on the insulating layer 210 on the surface 200b of the substrate 200. Each of the wire layers 212 may extend from the surface 200b of the substrate 200 into the corresponding opening 208 to electrically contact with the corresponding conducting pad 206. The material of the wire layer 212 may be a conducting material such as a metal material or another suitable conducting material. In one embodiment, the material of the wire layer 212 may be, for example, copper, aluminum, gold, platinum, or combinations thereof. The fabrication method for the wire layer 212 may include a physical vapor deposition process, chemical vapor deposition process, coating process, electroplating process, electroless plating process, or combinations thereof.

In one embodiment, a conducting layer may be first formed on the insulating layer 210 on the surface 200b of the substrate 200. Then, through a photolithography process and an etching process, the conducting layer is patterned to be the plurality of wire layers 212. In another embodiment, a seed layer (not shown) may be first formed on the insulating layer 210 on the surface 200b of the substrate 200. Then, a patterned mask layer (not shown) may be formed on the seed layer. The patterned mask layer may have a plurality of openings exposing a portion of the seed layer. Then, through an electroplating process, a conducting material may be electroplated onto the seed layer exposed by the openings of the patterned mask layer. Then, the patterned mask layer may be removed, and the seed layer originally covered by the patterned mask layer may be removed by using an etching process such that the formation of the wire layers 212 is accomplished.

FIG. 4B is a three-dimensional view showing the structure corresponding to the structure shown in FIG. 2D. As shown in FIGS. 2D and 4B, the plurality of wire layers 212 extend from positions on the insulating layer 210 on the surface 200b of the substrate 200 into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212. In addition, the wire layers 212 are separated from the seal ring structures 217 by the insulating layer 210 such that no short circuiting forms between the wire layers 212.

Next, as shown in FIG. 2E, a protection layer 214 is formed on the surface 200b of the substrate 200. The protection layer 214 may cover the substrate 200, the wire layers 212, and the openings 208. The protection layer 214 may include a solder mask material, green paint, polyimide, or another suitable insulating material. The protection layer 214 may be formed by using, for example, a coating process or a spray coating process. Then, the protection layer 214 may be patterned to have openings exposing a portion of the wire layers 212. In one embodiment, the protection layer 214 includes a positive type photoresist layer. In one embodiment, through a patterning process of the protection layer 214, the protection layer 214 is set to be not extended into the predetermined scribe lines SC. Thus, when a dicing process is subsequently performed along the predetermined scribe lines SC, a cutting blade does not cut the protection layer 214 such that the protection layer 214 is prevented from being damaged, and high stress of the protection layer 214 is prevented from affecting other material layers. Then, conducting bumps 216 may be formed on the exposed wire layers 212, which may be, for example, solder balls. In one embodiment, under bump metallurgy layers (not shown) may be first formed on the exposed wire layers 212 to facilitate the formation of the conducting bumps 216.

Next, a dicing process may be performed along the predetermined scribe lines SC to form a plurality of chip packages separated from each other. FIG. 2F is a cross-sectional view showing one of the chip packages, and FIGS. 3B and 4C respectively show a plane view and a three-dimensional view of the structure corresponding to the structure shown in FIG. 2F. In one embodiment, an edge of the protection layer 214 of the chip package is not coplanar with edges of the chip and/or the dielectric layer 204, and the edges are separated from each other by a distance d. After the dicing process is performed, a portion of the opening 208 becomes an opening 208c located at a side surface 200c of the substrate of the chip package, as shown in FIG. 3B or FIG. 4C.

As shown in FIGS. 2F, 3B, 3C and 4C, in another embodiment, the opening 208c may further have a lateral portion located on an edge of the chip. In one embodiment, the openings 208c may be set to extend along a direction intersecting the edge of the chip (such as the side surface 200c of the substrate 200 which connect the surfaces 200a and 200b) to extend beyond the region occupied by the conducing pads. The opening 208c may extend towards the edge of the chip. Between two adjacent openings 208c, the two openings 208c may also be separated from each other by the substrate 200 therebetween. In other words, the two adjacent openings 208c do not connect with each other and are separated from each other by the substrate 200. Thus, in one embodiment, the extending portion (wide portion) of the openings 208c extending along a direction substantially parallel to the edge of the chip (such as the side surface 200c) are still located within the occupation regions of the conducting pads without extending beyond the conducting pads. That is, the width W1 of the wide portion of the opening 208c may be smaller than or equal to the width W2 of the conducting pad 206. In addition, the conducting pad 206 is separated from the edge of the side surface 200c of the substrate 200 by a distance. In one embodiment, a plurality of openings 208c may be arranged a same side surface or different side surfaces of the substrate 200. In one embodiment, the wire layer 212 in the opening 208c does not extend to the edge of the chip or is not coplanar with the side surface 200c of the substrate 200 and a distance is therebetween. In one embodiment, a long axis direction of the opening 208c may be substantially perpendicular to or incline to the side surface 200c of the substrate 200, wherein the long axis direction may be substantially parallel to a connection line between two farthest terminal points of the opening 208c. In other words, in one embodiment, a portion (long portion) of the opening 208c extending along the long axis direction may intersect the side surface 200c of the substrate 200, and the long axis direction of the opening 208c may be substantially parallel to a normal vector of the intersected side surface 200c. In one embodiment, a contact interface between the wire layer 212 and the corresponding conducting pad 206 is separated from the side surface 200c of the substrate 200 by a distance. In a chip package of an embodiment, the conducting pad 206 is located within an edge surface of the chip, wherein the edge of the chip may be formed by the substrate 200 and the dielectric layers 204 and 204a.

Figure 5A:
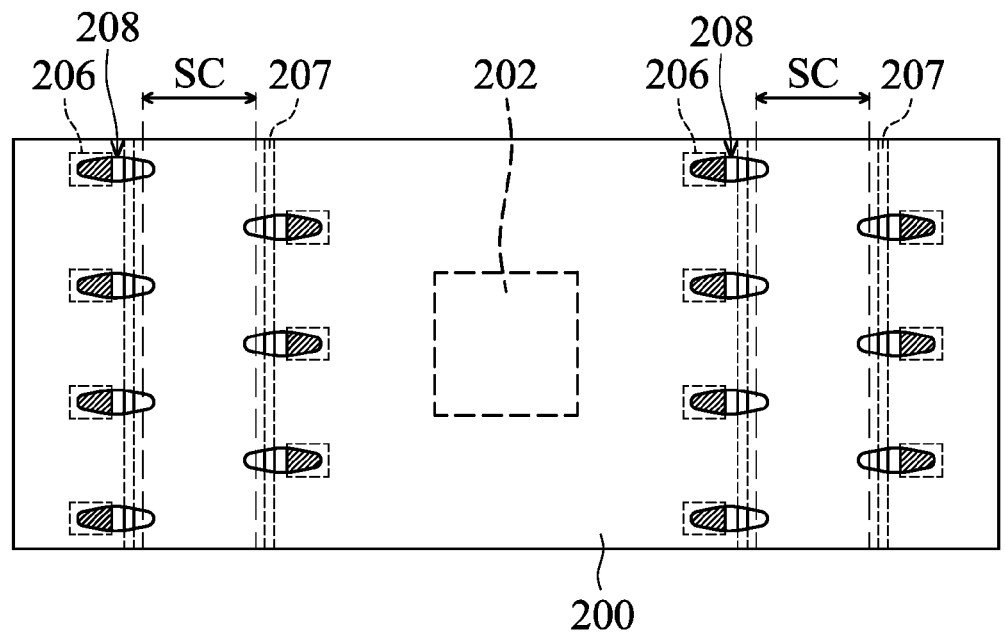
FIGS. 5A-5B are plane views showing the steps of forming a chip package according to an embodiment of the present invention.
Figure 5B:
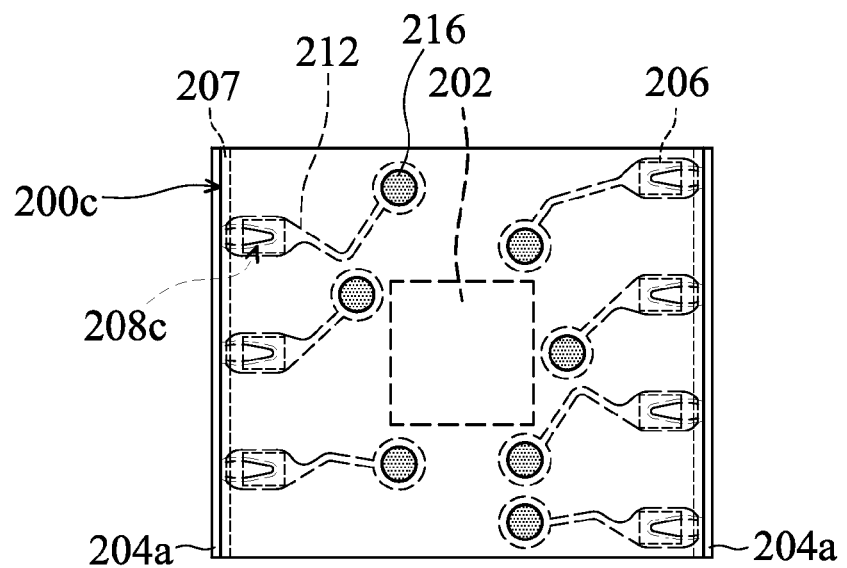

In the embodiment shown in FIGS. 2-4, the arrangement of the conducting pads 206 along both sides of the predetermined scribe line SC is substantially symmetrical, and each of the openings may correspond to a single conducting pad. However, embodiments of the invention are not limited thereto. FIGS. 5A-5B are plane views showing the steps of forming a chip package according to another embodiment of the present invention, wherein same or similar reference numbers are used to designate same or similar elements.

As shown in FIG. 5A, in this embodiment, the conducting pads 206 in adjacent die regions along both sides of the predetermined scribe line SC are asymmetrically disposed. In one embodiment, the openings 208 along both sides of the predetermined scribe line SC are also asymmetrically disposed. In one embodiment, the sidewall of the opening 208 may incline to the predetermined scribe line SC.

FIG. 5B is a plane view showing the chip package obtained from performing process steps similar to those illustrated in FIGS. 2-4 to the structure shown in FIG. 5A. As shown in FIG. 5B, in this chip package, a plurality of conducting pads 206 are disposed on a first periphery region of the substrate 200 (such as the periphery region of the substrate 200 on the left side), and the other plurality of conducting pads 206 are disposed on a second periphery region of the substrate 200 (such as the periphery region of the substrate 200 on the right side). The conducting pads 206 disposed on the first periphery region are not asymmetrical to the conducting pads 206 disposed on the second periphery region. In addition, the openings 208c exposing the conducting pads 206 on the first periphery region are also not symmetrical to the openings 208c exposing the conducting pads 206 on the second periphery region. In one embodiment, a sidewall of the opening 208c intersects the side surface 200c of the substrate 200, and the angle therebetween is less than 90 degree. In another embodiment, a sidewall of the opening 208c intersects the side surface 200c of the substrate 200, and the angle therebetween is substantially equal to 90 degree.

Figure 6A:
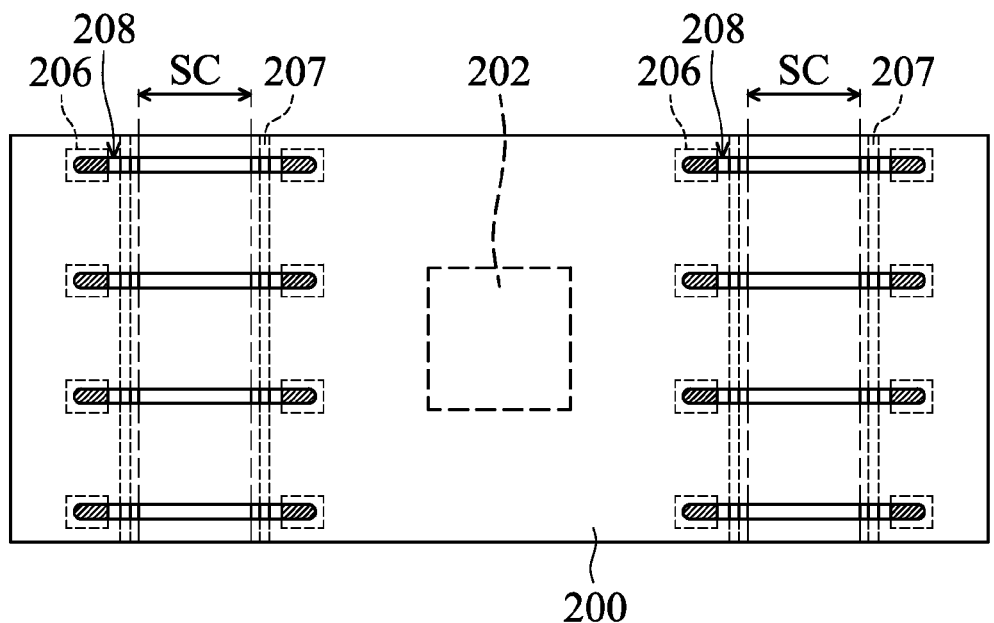
FIGS. 6A-6B are plane views showing the steps of forming a chip package according to an embodiment of the present invention.
Figure 6B:
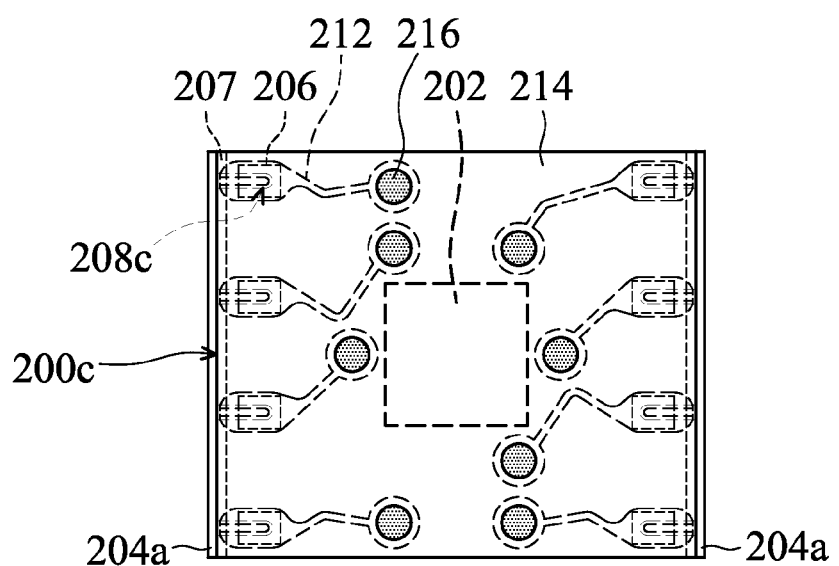

FIGS. 6A-6B are plane views showing the steps of forming a chip package according to an embodiment of the present invention. FIGS. 7A-7F are cross-sectional views showing the steps of forming a chip package corresponding to the embodiment shown in FIG. 6. FIGS. 8A-8C are three-dimensional views showing the steps of forming a chip package corresponding to the embodiment shown in FIG. 6. In the embodiment shown in FIGS. 6-8, same or similar reference numbers are used to designate same or similar elements.

Figure 7A:
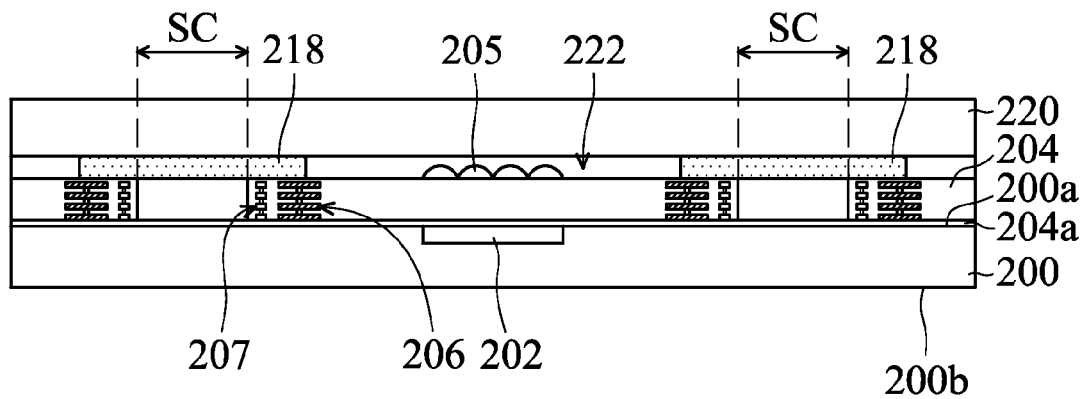
FIGS. 7A-7F are cross-sectional views showing the steps of forming a chip package according to an embodiment of the present invention.
Figure 7B:
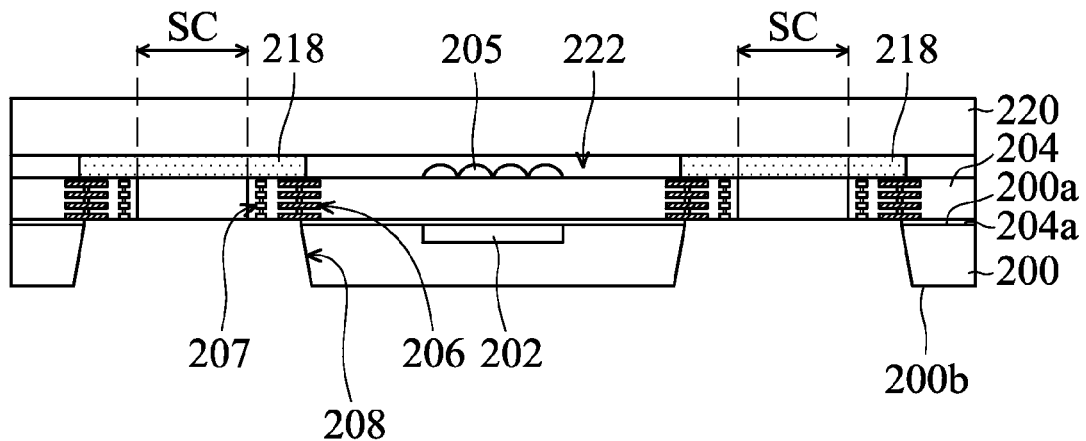
Figure 8A:
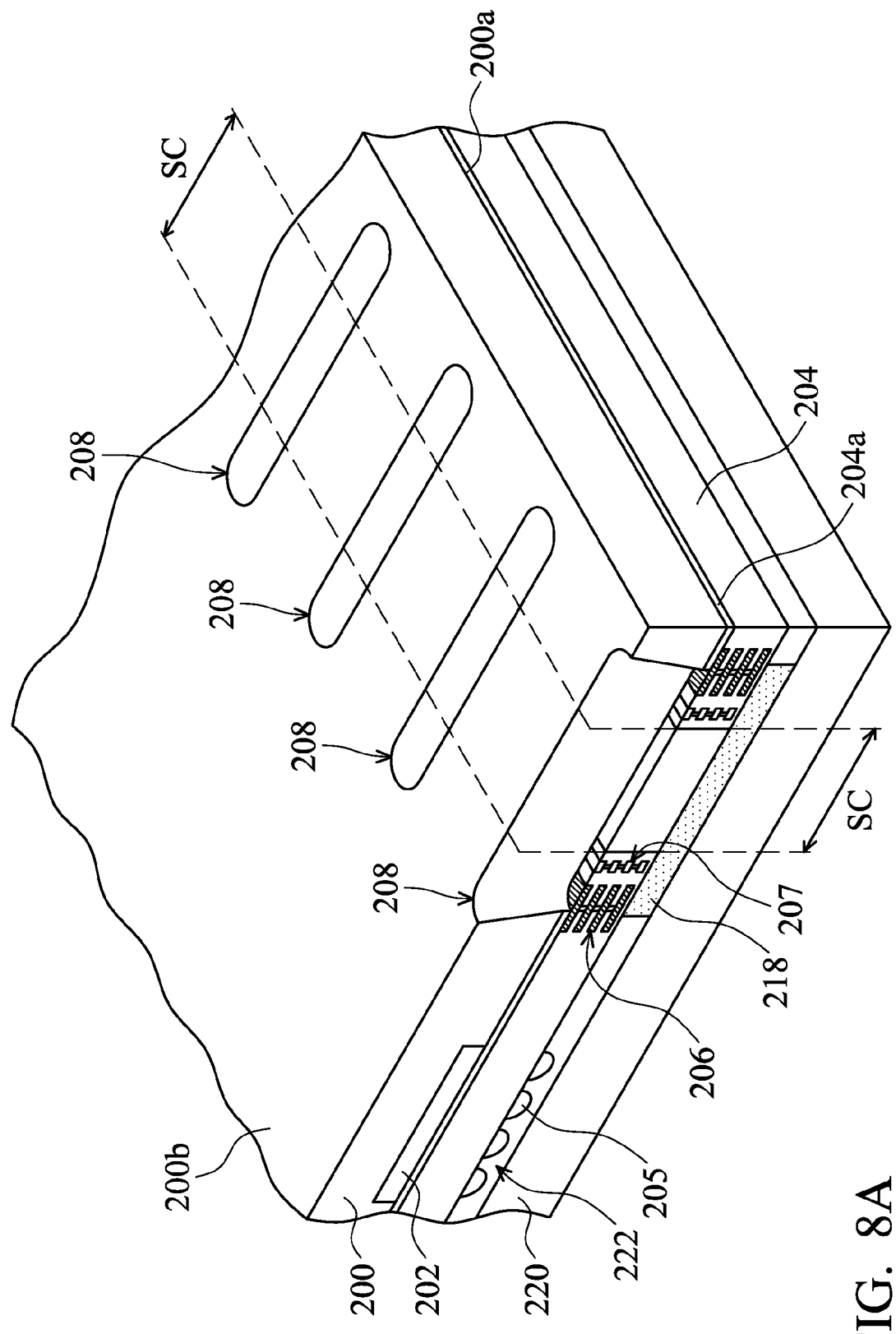
FIGS. 8A-8C are three-dimensional views showing the steps of forming a chip package according to an embodiment of the present invention.
Figure 8B:
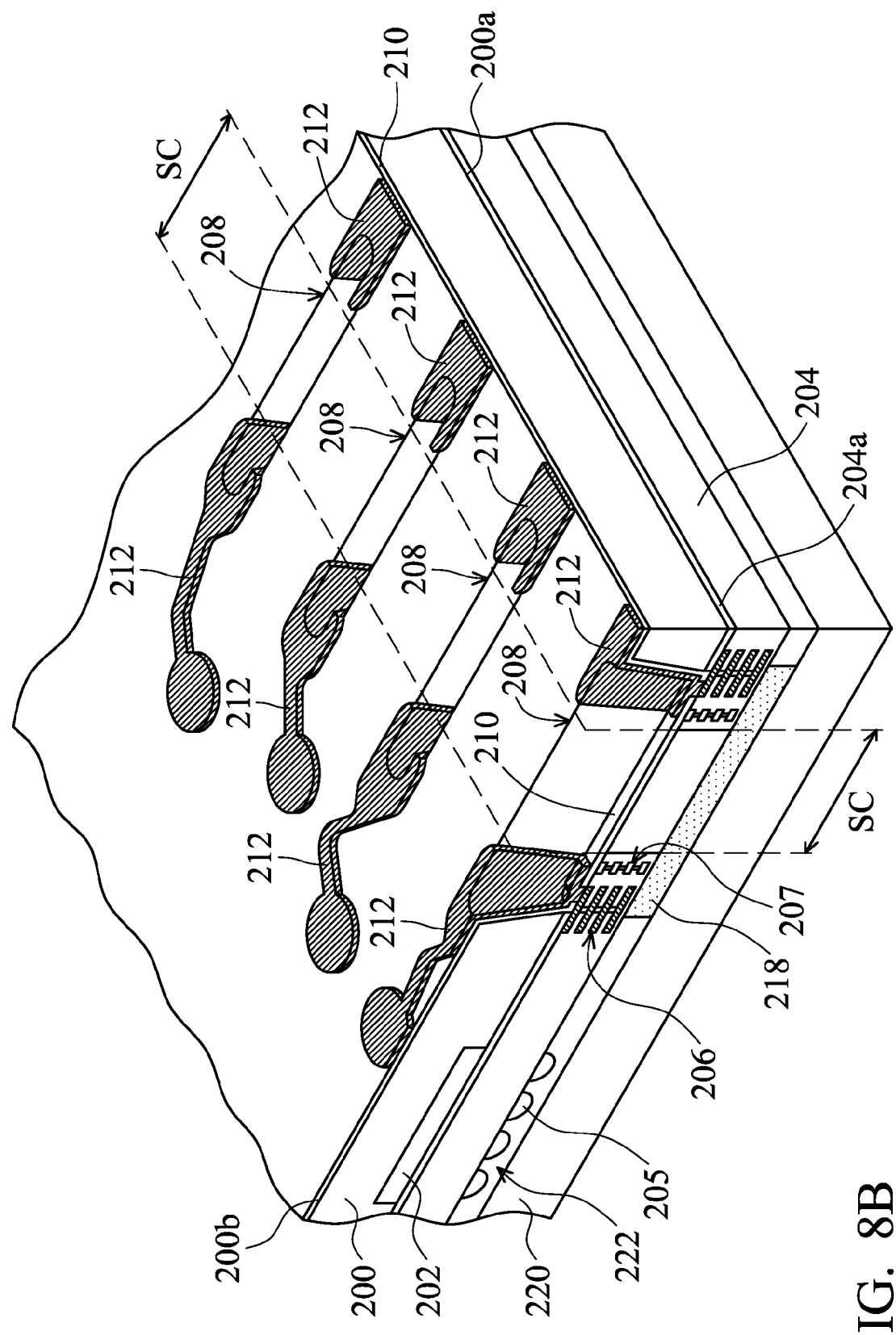
Figure 8C:
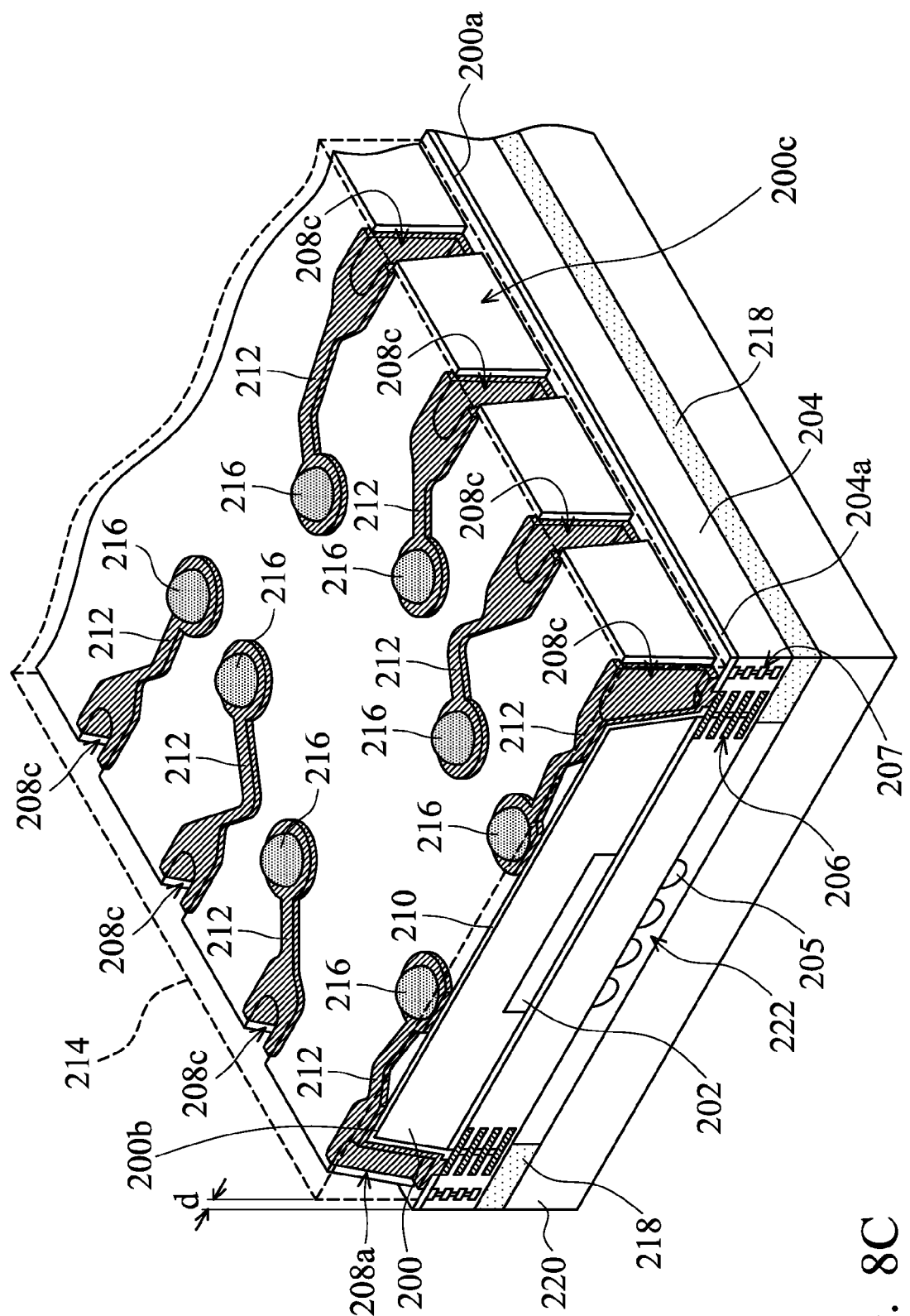

As shown in FIG. 7A, in one embodiment, a structure similar to that shown in FIG. 2A is provided. Next, as shown in FIG. 7B, through, for example, a photolithography process and an etching process, a portion of the substrate 200 is removed to form a plurality of openings 208 extending from the surface 200b towards the surface 200a of the substrate 200. Then, a portion of the dielectric layer 204a may be further removed to expose the conducting pads 206. In one embodiment, the openings 208 may expose the conducting pads 206 and the seal ring structures 207, respectively and correspondingly.

FIGS. 6A and 8A are a plane view and a three-dimensional view showing the structure corresponding to that shown in FIG. 7B, respectively. As shown in FIGS. 6A and 8A, in one embodiment, the openings 208 respectively extend from the corresponding conducting pads 206 into the corresponding predetermined scribe lines SC and further extend towards the conducting pads along another side of the predetermined scribe line SC to expose the conducting pads on the other side. That is, the opening 208 may extend across over the predetermined scribe line SC to expose the conducting pads in two adjacent die regions. In one embodiment, a width of the opening 208 is smaller than or equal to a width of the conducting pad 206. Because the opening 208 extends from the conducting pad 206 into the predetermined scribe line SC and extends to the conducting pad 206 on the other side, the aspect ratio of the opening 208 is thus reduced, which facilitates subsequent depositions of a variety of material layers in the opening 208.

Figure 7C:
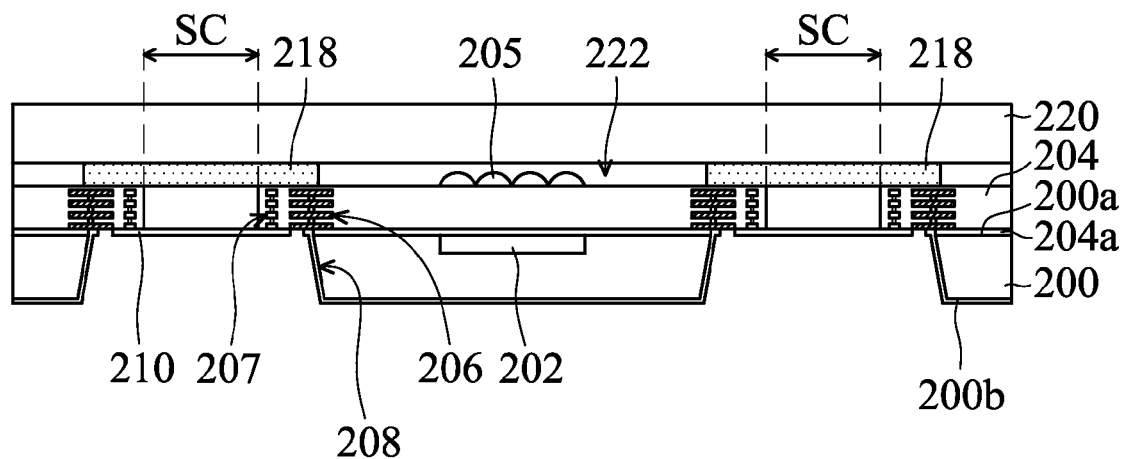

Next, as shown in FIG. 7C, an insulating layer 210 may be formed on the surface 200b of the substrate 200, which may extend into the openings 208. Then, by using a photolithography process and an etching process, a portion of the insulating layer 210 located on the bottom of the opening 208 may be removed to expose the conducting pad 206. In one embodiment, it is preferable that the insulating layer 210 still completely covers the seal ring structures 207 to prevent subsequently formed wire layers from contacting with the seal ring structures 207 and causing a short circuiting.

Figure 7D:
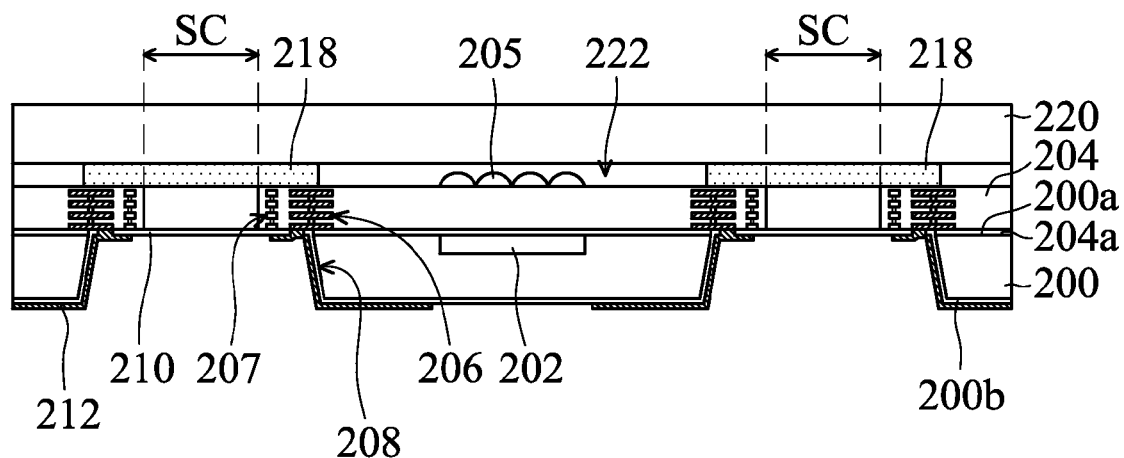

As shown in FIG. 7D, a plurality of wire layers 212 are then formed on the insulating layer 210 on the surface 200b of the substrate 200. Each of the wire layers 212 may extend from the surface 200b of the substrate 200 into the corresponding opening 208 to electrically contact with the corresponding conducting pad 206.

FIG. 8B is a three-dimensional view showing the structure corresponding to the structure shown in FIG. 7D. As shown in FIGS. 7D and 8B, the plurality of wire layers 212 extend from positions on the insulating layer 210 on the surface 200b of the substrate 200 into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212. In addition, the wire layers 212 are separated from the seal ring structures 217 by the insulating layer 210 such that no short circuiting forms between the wire layers 212. In this embodiment, because the opening 208 extends across over the predetermined scribe line SC and has a wider width, it is easier to form an insulating layer or a conducting layer in the opening 208.

Figure 7E:
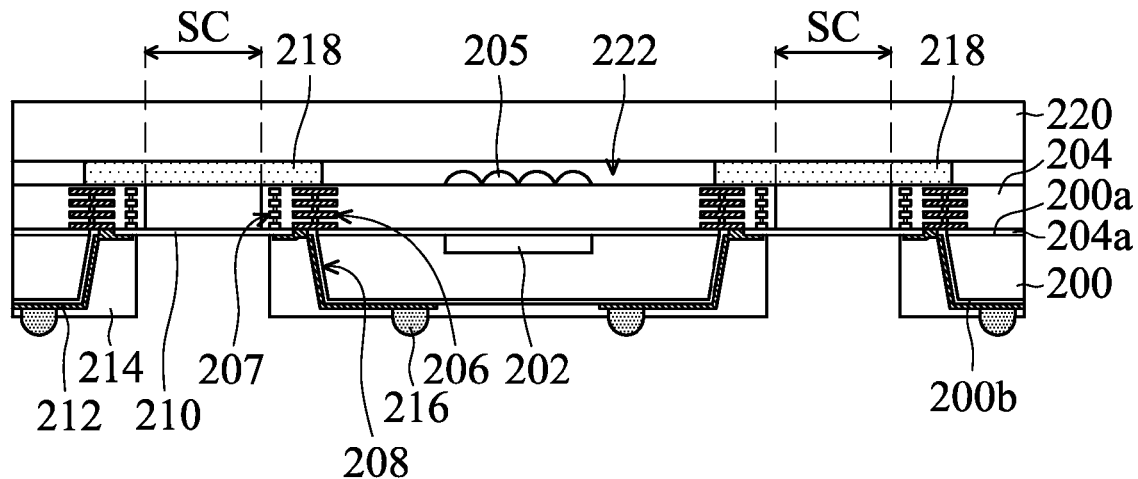

Next, as shown in FIG. 7E, a protection layer 214 is formed on the surface 200b of the substrate 200. The protection layer 214 may cover the substrate 200, the wire layers 212, and the openings 208. Then, the protection layer 214 may be patterned to have openings exposing a portion of the wire layers 212. In one embodiment, through a patterning process of the protection layer 214, the protection layer 214 is set to be not extended into the predetermined scribe lines SC. Then, conducting bumps 216 may be formed on the exposed wire layers 212, which may be, for example, solder balls.

Figure 7F:
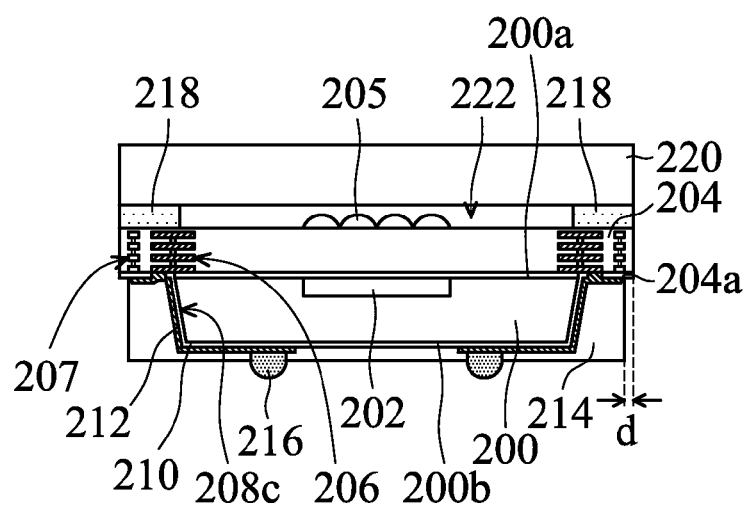

Next, a dicing process may be performed along the predetermined scribe lines SC to form a plurality of chip packages separated from each other. FIG. 7F is a cross-sectional view showing one of the chip packages, and FIGS. 6B and 8C respectively show a plane view and a three-dimensional view of the structure corresponding to the structure shown in FIG. 7F. In one embodiment, an edge of the protection layer 214 of the chip package is not coplanar with edges of the chip and/or the dielectric layer 204, and the edges are separated from each other by a distance d. After the dicing process is performed, a portion of the opening 208 becomes an opening 208c located at a side surface 200c of the substrate of the chip package, as shown in FIG. 6B or FIG. 8C.

As shown in FIGS. 7F, 6B, and 8C, the chip package of the embodiment may be substantially similar to the chip package of the embodiment shown in FIGS. 2F, 3B, and 4C. In one embodiment, the openings 208c exposes the corresponding conducting pad 206 and extends towards the side surface 200c of the substrate 200 along a direction intersecting the side surface 200c of the substrate 200 to extend beyond the conducing pads 206. In one embodiment, the opening 208c extends to the side surface 200c of the substrate 200, as shown in FIG. 8C.

Embodiments of the invention may have many variations. For example, FIGS. 9A-9B are plane views showing the steps of forming a chip package according to an embodiment of the present invention, wherein same or similar reference numbers are used to designate same or similar elements.

Figure 9A:
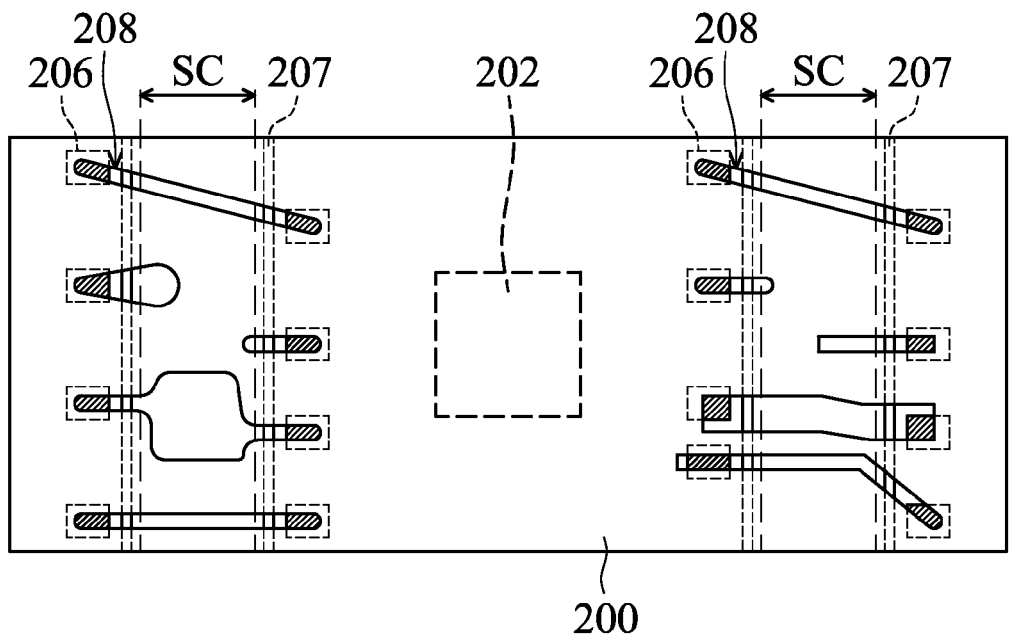
FIGS. 9A-9B are plane views showing the steps of forming a chip package according to an embodiment of the present invention.

As shown in FIG. 9A, in one embodiment, the conducting pads 206 in the adjacent die regions along both sides of the predetermined scribe lines SC are asymmetrically disposed. In addition, the openings 208 may have many variations. For example, the opening 208 may extend across over the predetermined scribe line SC to expose the conducting pads 206 in two adjacent die regions, and a sidewall of the opening 208 may incline to the conducting pad 206. Alternatively, the opening 208 may have a variety of shapes such as (but is not limited to) a sector, rectangle, or ellipse. Alternatively, the opening 208 may have a turning portion. In one embodiment, the opening 208 may extend over the conducting pad 206. Any arrangement, shape, combination, or inclining way of the sidewall of the opening of the opening, which can help a subsequent deposition of material layers, is within the scope of the embodiments of the invention.

Figure 9B:
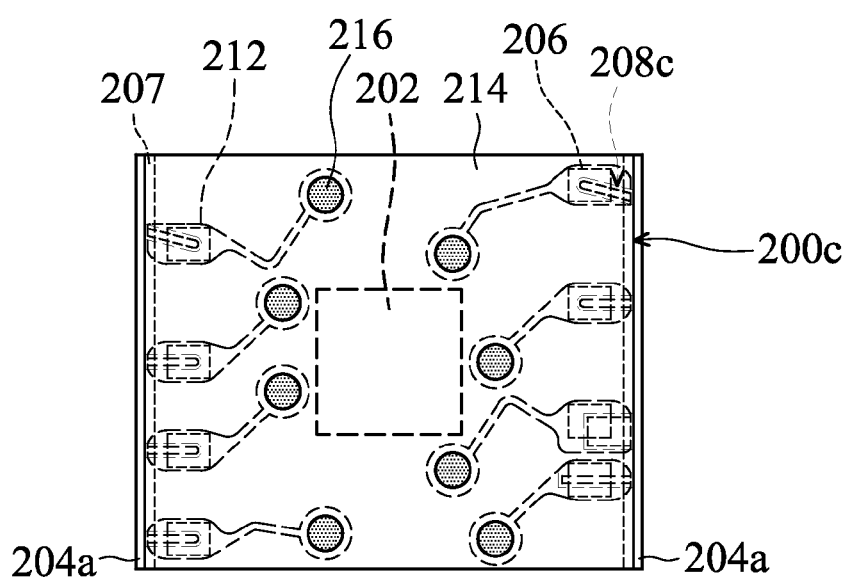

FIG. 9B is a plane view showing the chip package obtained from performing process steps similar to those illustrated in FIGS. 2-4 to the structure shown in FIG. 9A. As shown in FIG. 9B, in this chip package, a plurality of conducting pads 206 are disposed on a first periphery region of the substrate 200 (such as the periphery region of the substrate 200 on the left side), and the other plurality of conducting pads 206 are disposed on a second periphery region of the substrate 200 (such as the periphery region of the substrate 200 on the right side). The conducting pads 206 disposed on the first periphery region are not asymmetrical to the conducting pads 206 disposed on the second periphery region. In addition, the openings 208c exposing the conducting pads 206 on the first periphery region are also not symmetrical to the openings 208c exposing the conducting pads 206 on the second periphery region. In addition, in this embodiment, angles between the sidewalls of the different openings 208c and the side surface of the substrate 200 are not completely the same. Angles between the sidewalls of the different openings 208 and the edges of the conducting pads 206 are also not completely the same.

Figure 10A:
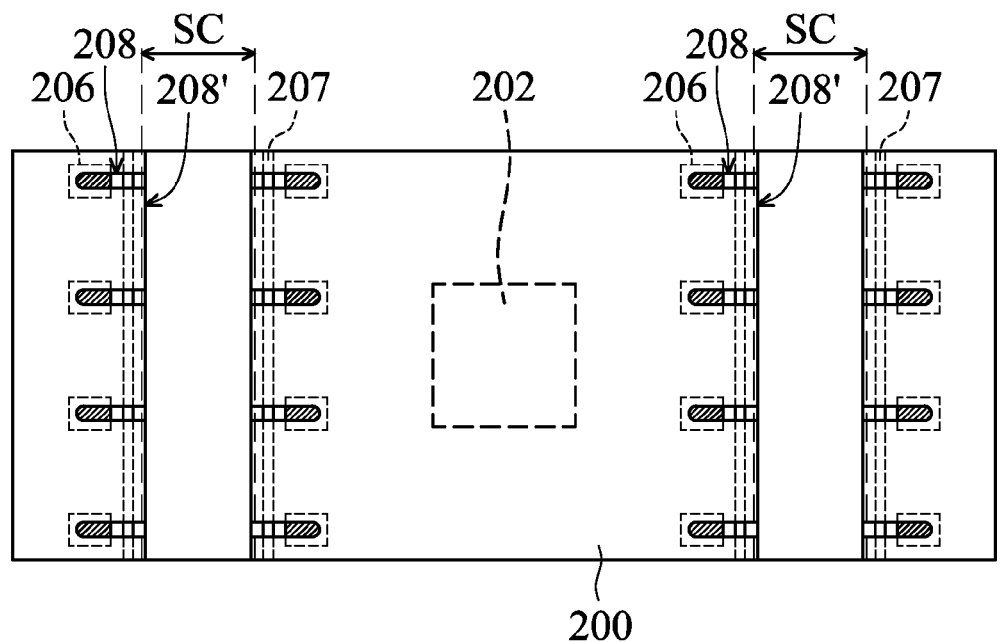
FIGS. 10A-10B are plane views showing the steps of forming a chip package according to an embodiment of the present invention.
Figure 10B:
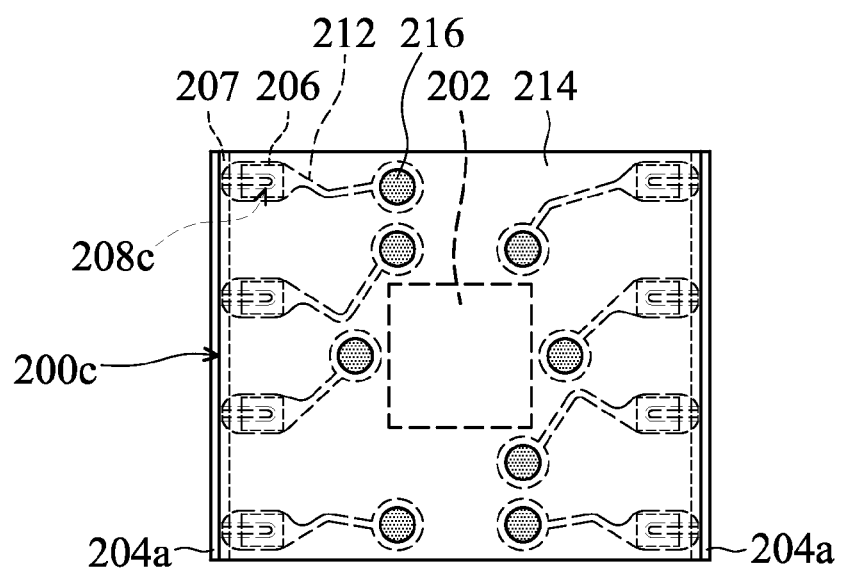

FIGS. 10A-10B are plane views showing the steps of forming a chip package according to an embodiment of the present invention. FIGS. 11A-11F are cross-sectional views showing the steps of forming a chip package corresponding to the embodiment shown in FIG. 10. FIGS. 12A-12C are three-dimensional views showing the steps of forming a chip package corresponding to the embodiment shown in FIG. 10. In the embodiment shown in FIGS. 10-12, same or similar reference numbers are used to designate same or similar elements.

Figure 11A:
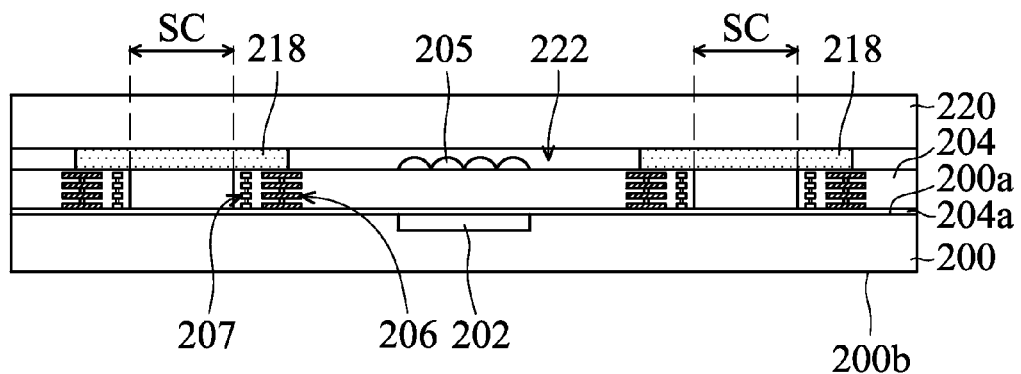
FIGS. 11A-11F are cross-sectional views showing the steps of forming a chip package according to an embodiment of the present invention.
Figure 11B:
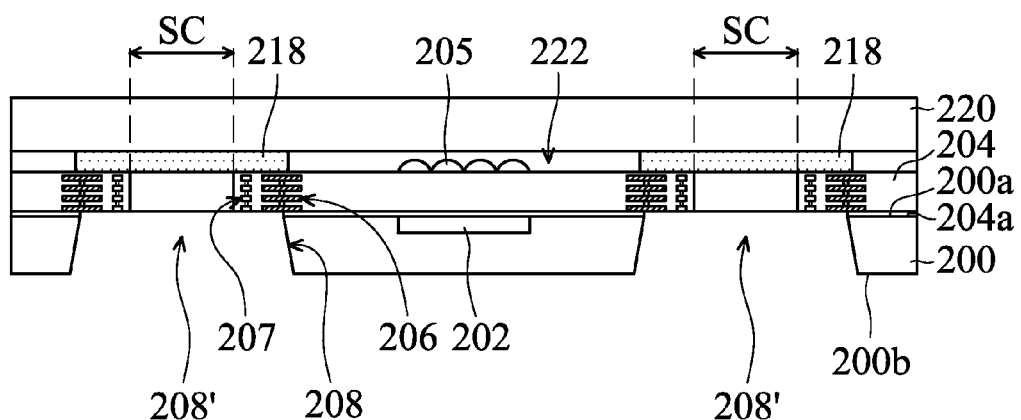
Figure 12A:
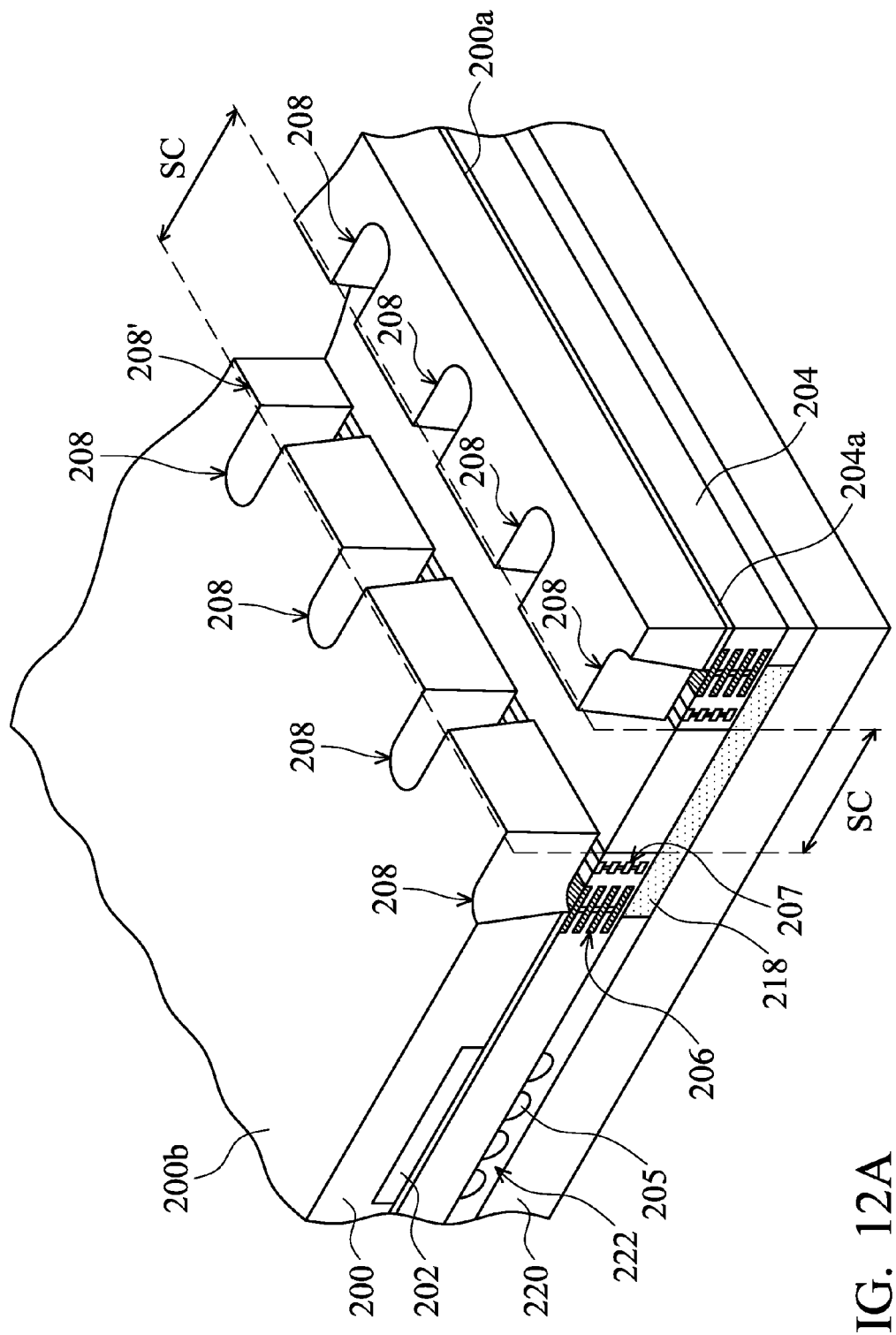
FIGS. 12A-12C are three-dimensional views showing the steps of forming a chip package according to an embodiment of the present invention.
Figure 12B:
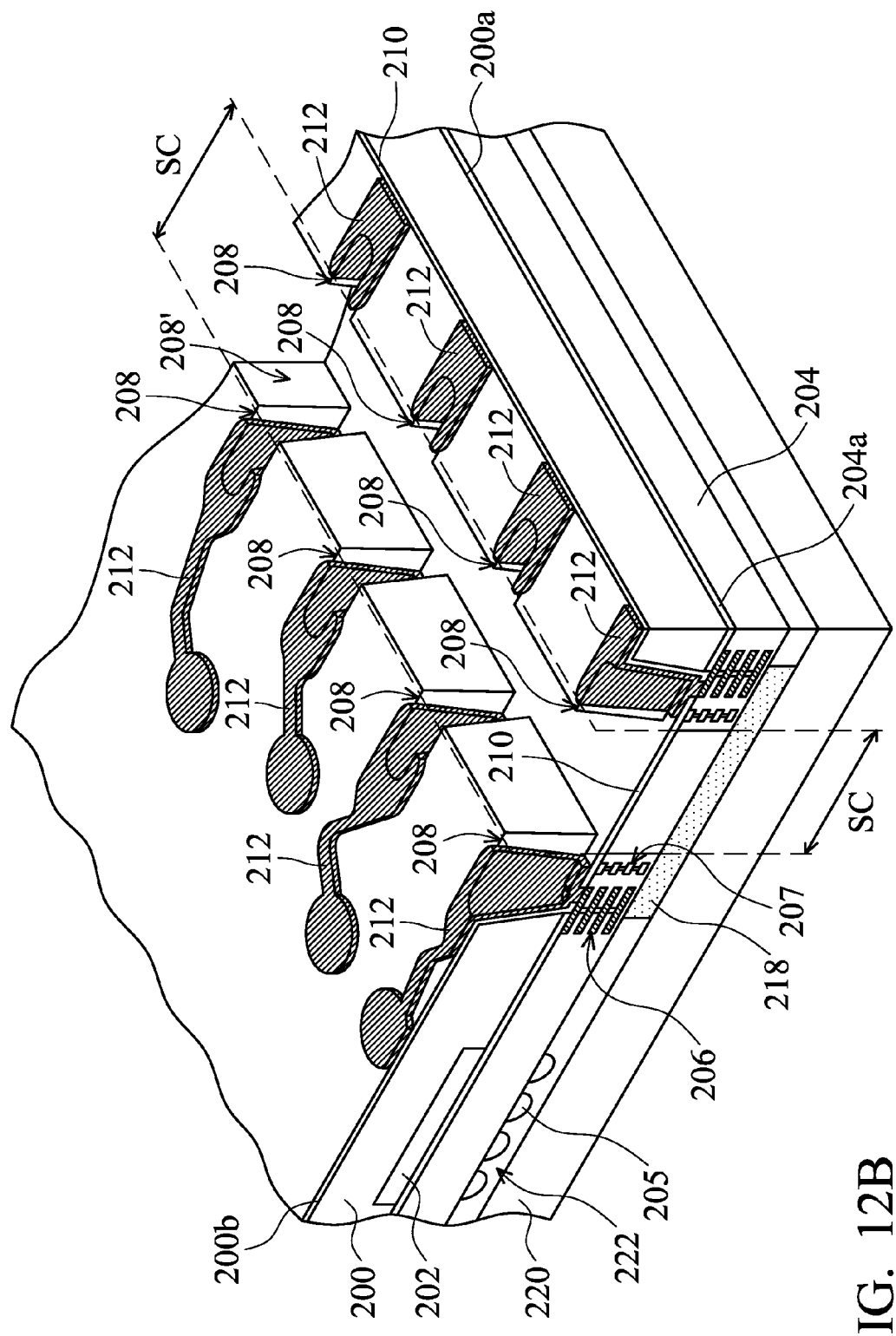
Figure 12C:
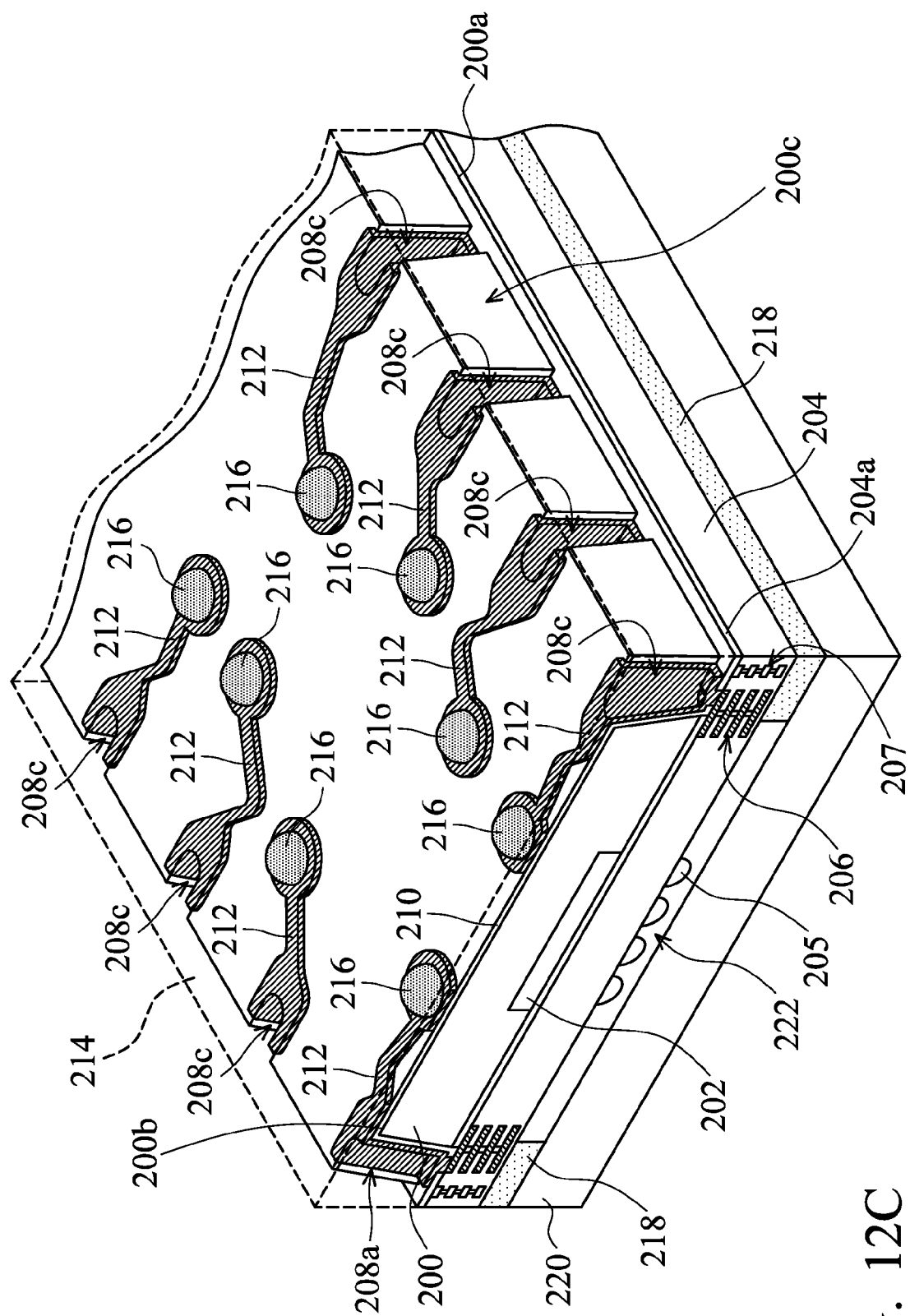

As shown in FIG. 11A, in one embodiment, a structure similar to that shown in FIG. 2A is provided. Next, as shown in FIG. 11B, through, for example, a photolithography process and an etching process, a portion of the substrate 200 is removed to form a plurality of openings 208 extending from the surface 200b towards the surface 200a of the substrate 200. Then, a portion of the dielectric layer 204a may be further removed to expose the conducting pads 206. In one embodiment, the openings 208 may expose the conducting pads 206 and the seal ring structures 207, respectively and correspondingly. In one embodiment, by using, for example, a photolithography process and an etching process, a portion of the substrate 200 may be optionally removed to form a plurality of recesses 208' (which is, for example, trenches) extending from the surface 200b towards the surface 200a of the substrate 200. The recesses 208' may connect with the openings 208 mentioned above. In one embodiment, the openings 208 and the recesses 208' may be formed in a same patterning process.

FIGS. 10A and 12A are a plane view and a three-dimensional view showing the structure corresponding to that shown in FIG. 11B, respectively. As shown in FIGS. 10A and 12A, in one embodiment, the openings 208 respectively extend from the corresponding conducting pads 206 into the corresponding predetermined scribe lines SC to connect with the formed recesses 208' and further extend towards the conducting pads along another side of the predetermined scribe line SC to expose the conducting pads on the other side. That is, the opening 208 may extend across over the predetermined scribe line SC to connect with the recess 208' and extend to the conducting pad 206 in another die region to expose the conducting pads 206 in two adjacent die regions. In one embodiment, a width of the opening 208 is smaller than or equal to a width of the conducting pad 206. Because the opening 208 extends from the conducting pad 206 into the predetermined scribe line SC to connect with the recess 208' and extends to the conducting pad 206 on the other side, the aspect ratio of the opening (including the opening 208 and the recess 208') is thus reduced, which facilitates subsequent depositions of a variety of material layers in the opening.

Figure 11C:
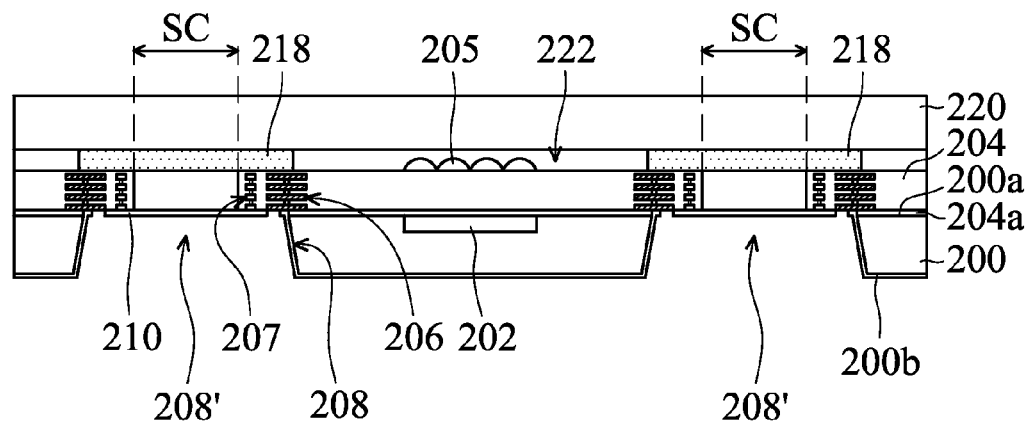

Next, as shown in FIG. 11C, an insulating layer 210 may be formed on the surface 200b of the substrate 200, which may extend into the openings 208. Then, by using a photolithography process and an etching process, a portion of the insulating layer 210 located on the bottom of the opening 208 may be removed to expose the conducting pad 206. In one embodiment, it is preferable that the insulating layer 210 still completely covers the seal ring structures 207 to prevent subsequently formed wire layers from contacting with the seal ring structures 207 and causing a short circuiting.

Figure 11D:
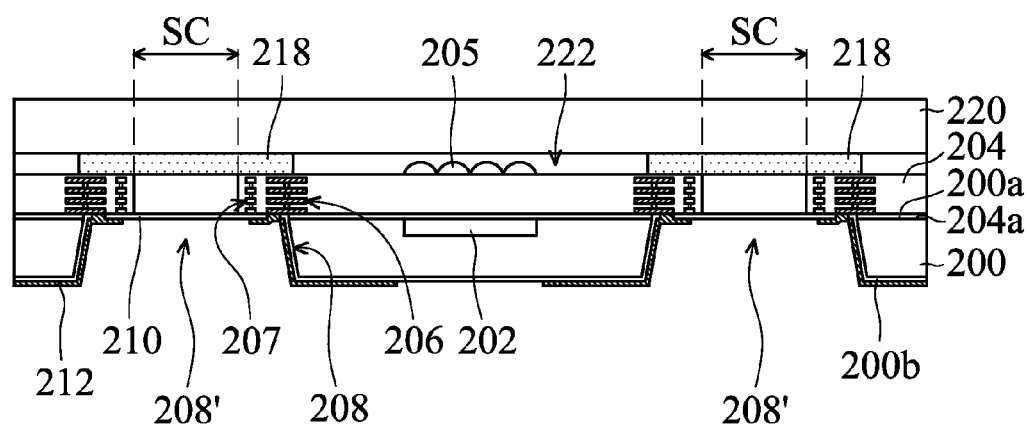

As shown in FIG. 11D, a plurality of wire layers 212 are then formed on the insulating layer 210 on the surface 200b of the substrate 200. Each of the wire layers 212 may extend from the surface 200b of the substrate 200 into the corresponding opening 208 to electrically contact with the corresponding conducting pad 206.

FIG. 12B is a three-dimensional view showing the structure corresponding to the structure shown in FIG. 11D. As shown in FIGS. 11D and 12B, the plurality of wire layers 212 extend from positions on the insulating layer 210 on the surface 200b of the substrate 200 into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212. In addition, the wire layers 212 are separated from the seal ring structures 217 by the insulating layer 210 such that no short circuiting forms between the wire layers 212. In this embodiment, because the opening 208 extends across over the predetermined scribe line SC and connects with the recess 208' to have a wider width, it is easier to form an insulating layer or a conducting layer in the opening 208.

Figure 11E:
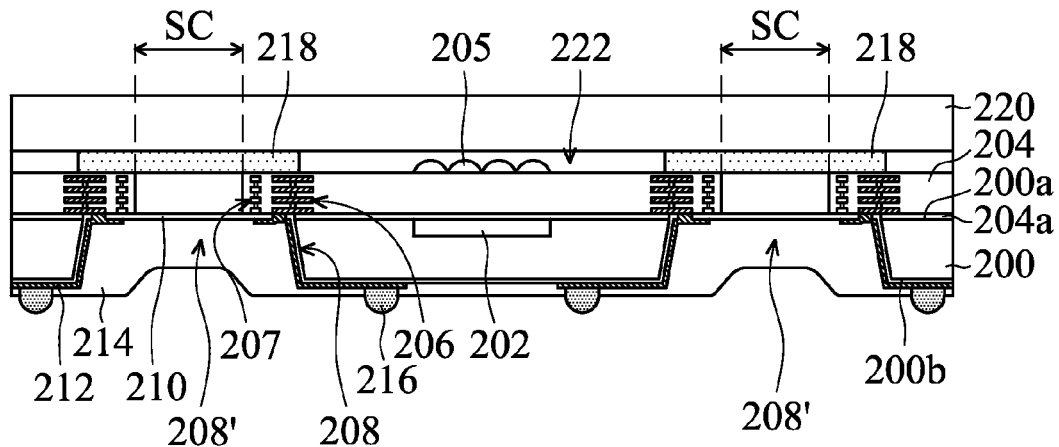

Next, as shown in FIG. 11E, a protection layer 214 is formed on the surface 200b of the substrate 200. The protection layer 214 may cover the substrate 200, the wire layers 212, the openings 208, and the recesses 208'. Then, the protection layer 214 may be patterned to have openings exposing a portion of the wire layers 212. In one embodiment, through a patterning process of the protection layer 214, the protection layer 214 is set to be not extended into the predetermined scribe lines SC (not shown). Then, conducting bumps 216 may be formed on the exposed wire layers 212, which may be, for example, solder balls.

Figure 11F:
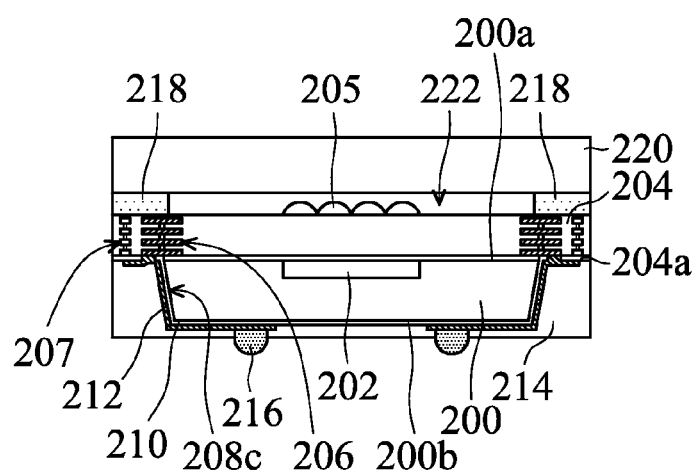

Next, a dicing process may be performed along the predetermined scribe lines SC to form a plurality of chip packages separated from each other. FIG. 11F is a cross-sectional view showing one of the chip packages, and FIGS. 10B and 12C respectively show a plane view and a three-dimensional view of the structure corresponding to the structure shown in FIG. 11F. After the dicing process is performed, a portion of the opening 208 becomes an opening 208c located at a side surface 200c of the substrate of the chip package, as shown in FIG. 10B or FIG. 12C.

As shown in FIGS. 11F, 10B, and 12C, the chip package of the embodiment may be substantially similar to the chip package of the embodiment shown in FIGS. 2F, 3B, and 4C. In one embodiment, the openings 208c exposes the corresponding conducting pad 206 and extends towards the side surface 200c of the substrate 200 along a direction intersecting the side surface 200c of the substrate 200 to extend beyond the conducing pads 206. In one embodiment, the opening 208c extends to the side surface 200c of the substrate 200, as shown in FIG. 12C.

Figure 13A:
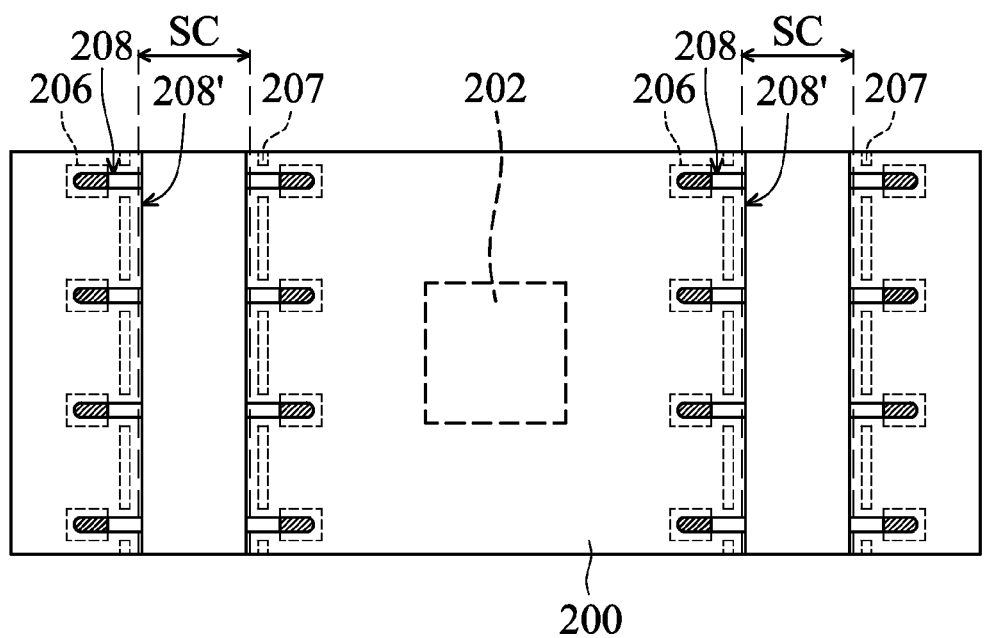
FIGS. 13A-13B are plane views showing the steps of forming a chip package according to an embodiment of the present invention.
Figure 13B:
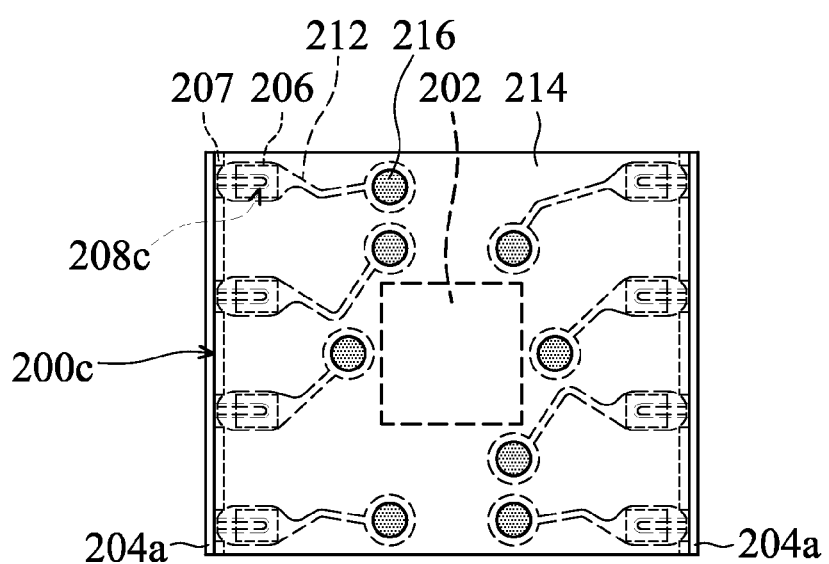

FIGS. 13A-13B are plane views showing the steps of forming a chip package according to an embodiment of the present invention. FIGS. 14A-14G are cross-sectional views showing the steps of forming a chip package corresponding to the embodiment shown in FIG. 13. FIGS. 15A-15C are three-dimensional views showing the steps of forming a chip package corresponding to the embodiment shown in FIG. 13. In the embodiment shown in FIGS. 13-15, same or similar reference numbers are used to designate same or similar elements.

Figure 14A:
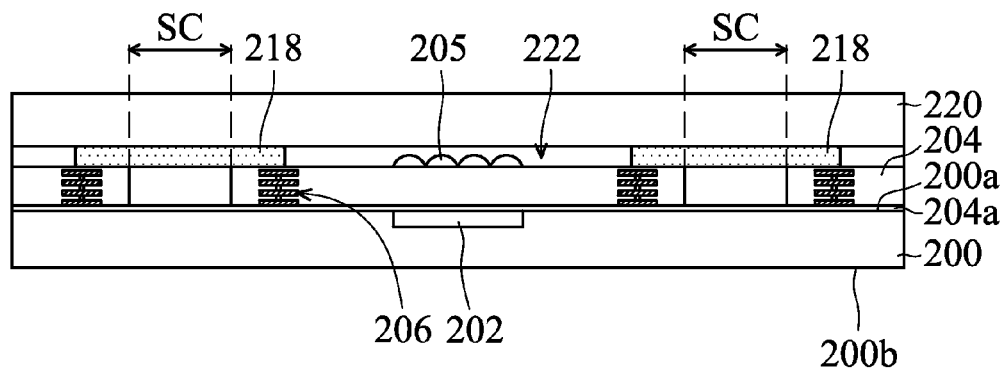
FIGS. 14A-14G are cross-sectional views showing the steps of forming a chip package according to an embodiment of the present invention.
Figure 14B:
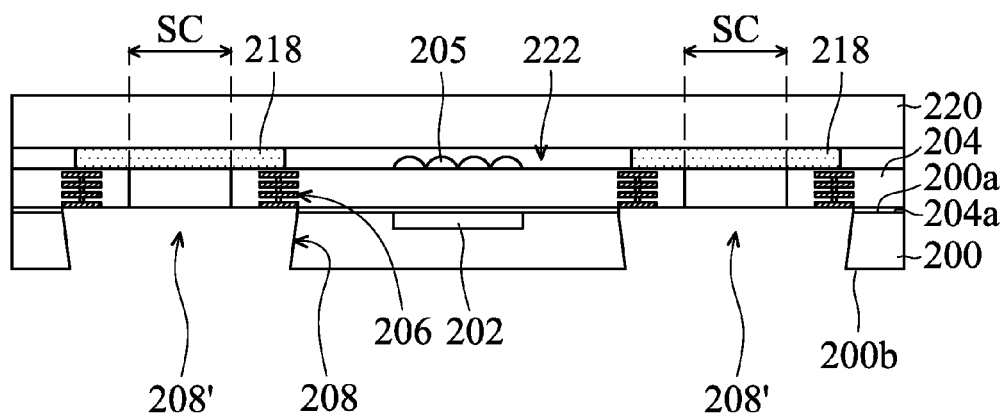
Figure 15A:
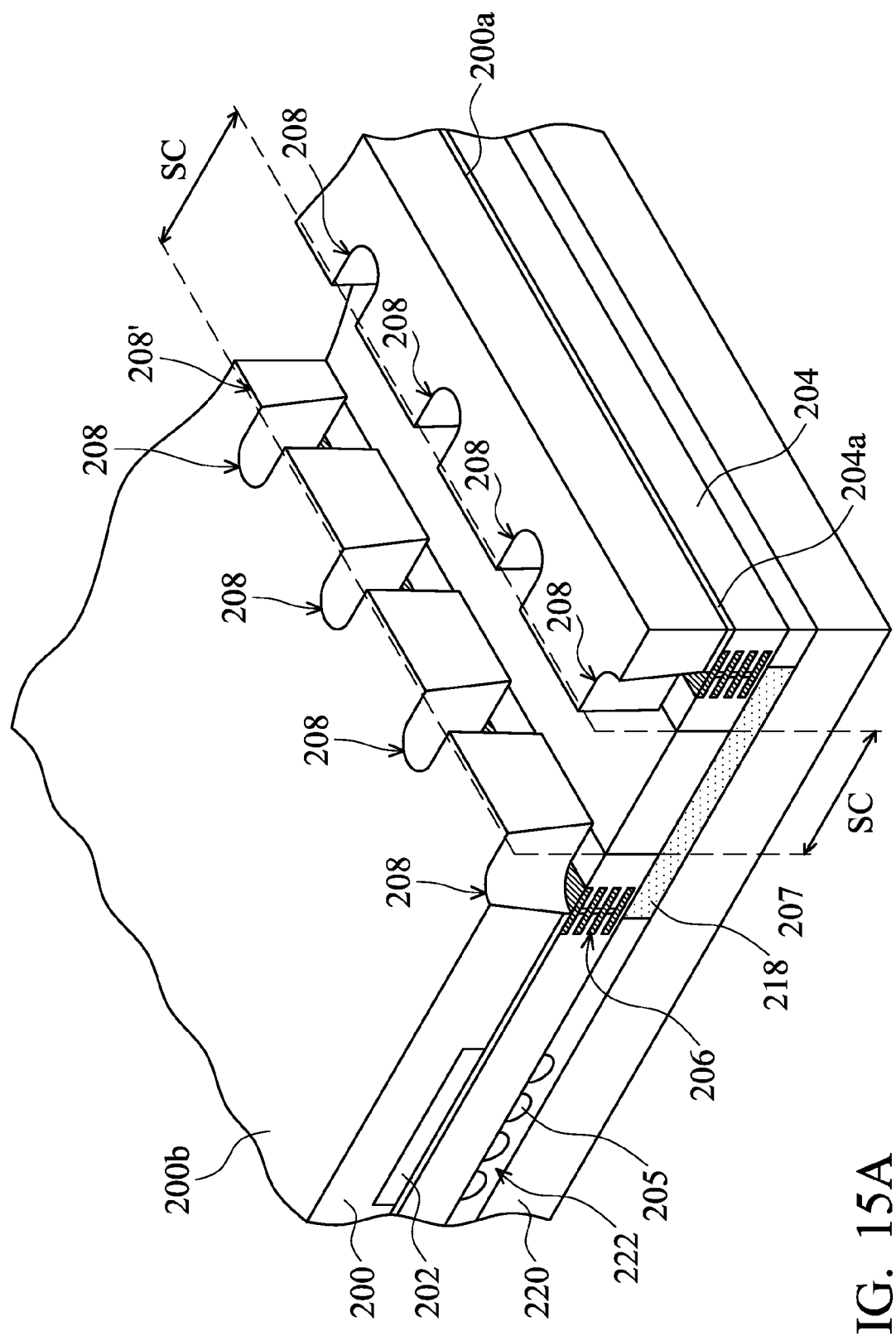
FIGS. 15A-15C are three-dimensional views showing the steps of forming a chip package according to an embodiment of the present invention.
Figure 15B:
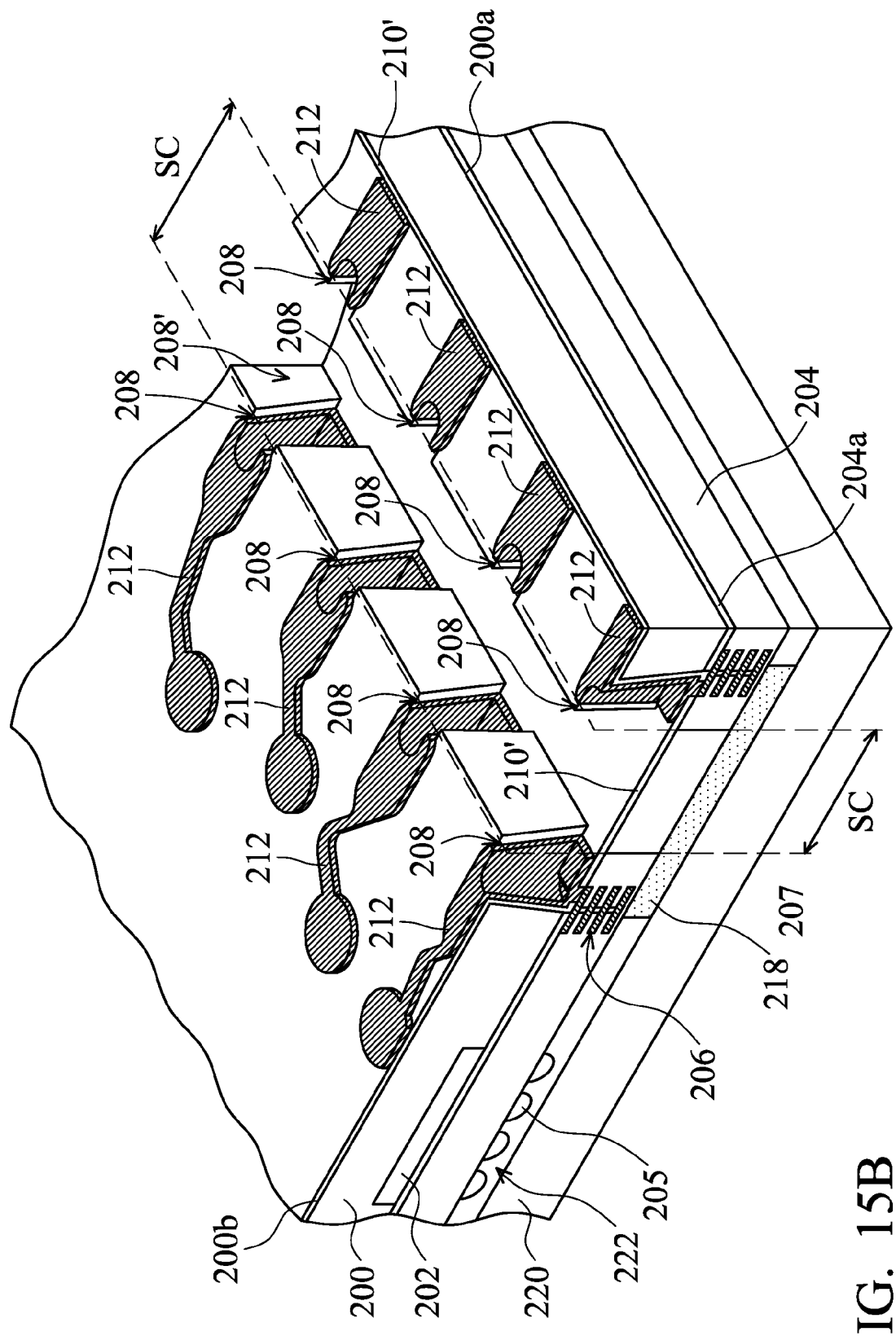
Figure 15C:
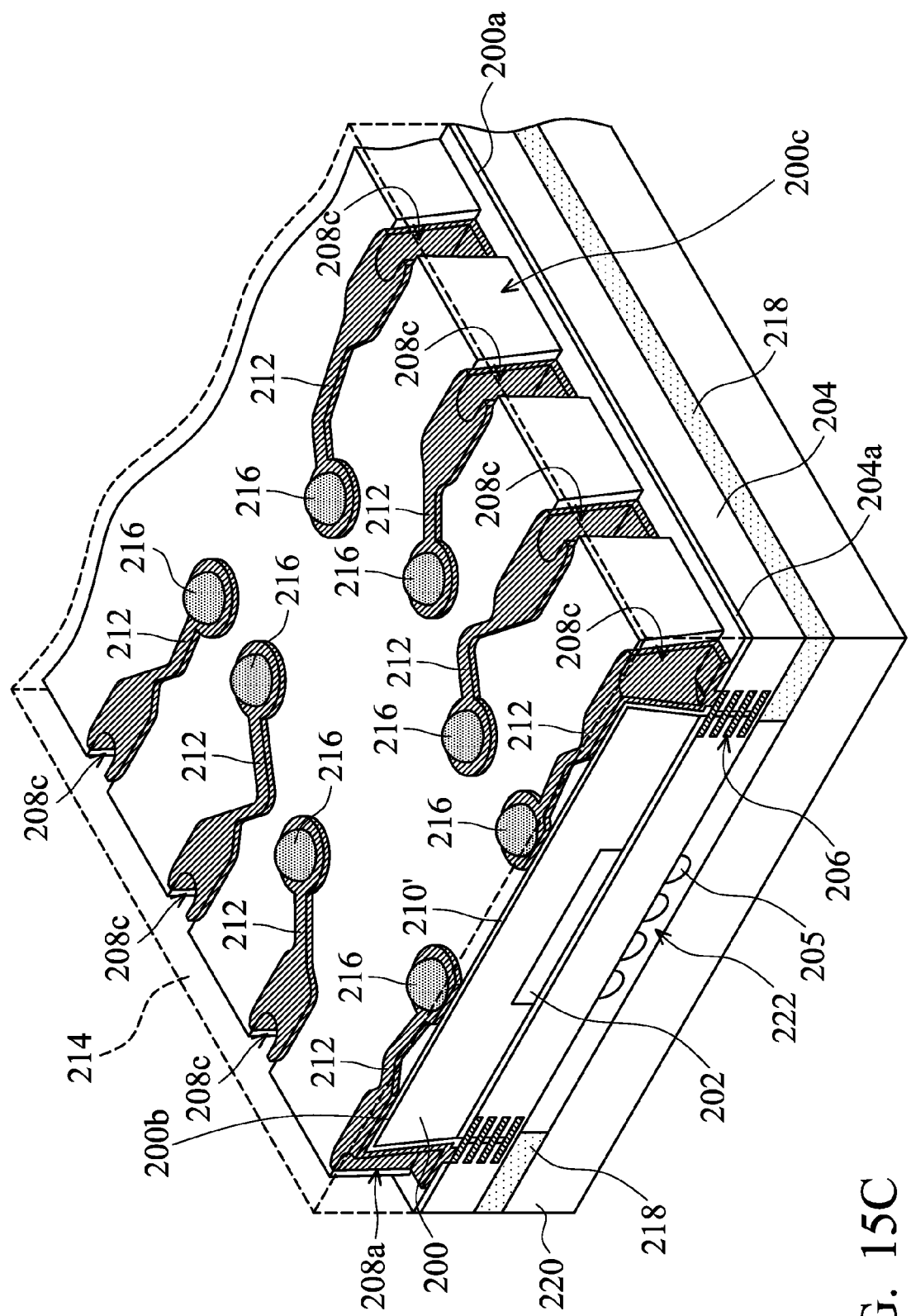

As shown in FIG. 14A, in one embodiment, a structure similar to that shown in FIG. 2A is provided. Next, as shown in FIG. 14B, through, for example, a photolithography process and an etching process, a portion of the substrate 200 is removed to form a plurality of openings 208 extending from the surface 200b towards the surface 200a of the substrate 200. In this embodiment, a width of the opening 208 gradually increases along a direction extending from the surface 200b of the substrate 200 towards the conducting pad 206. In one embodiment, through modification of the etching process, the openings 208 as shown in FIG. 14B may be formed. Then, a portion of the dielectric layer 204a may be further removed to expose the conducting pads 206.

In addition, referring to FIGS. 13A and 13B, in this embodiment, the seal ring structure 207 disposed in the dielectric layer 204 includes a plurality of seal rings which are disposed along edges of the predetermined scribe lines SC, respectively, and do not overlap the openings 208. That is, the openings 208 do not expose the seal ring structures 207. The seal ring structure 207 is located outside of the projection region of the opening 208 on the dielectric layer 204. In one embodiment, the seal ring structure is discontinuous.

In one embodiment, by using, for example, a photolithography process and an etching process, a portion of the substrate 200 may be optionally removed to form a plurality of recesses 208' (which is, for example, trenches) extending from the surface 200b towards the surface 200a of the substrate 200. The recesses 208' may connect with the openings 208 mentioned above. In one embodiment, the openings 208 and the recesses 208' may be formed in a same patterning process. In one embodiment, a width of the recess 208' gradually increases along a direction extending from the surface 200b of the substrate 200 towards the conducting pad 206.

FIGS. 13A and 15A are a plane view and a three-dimensional view showing the structure corresponding to that shown in FIG. 14B, respectively. As shown in FIGS. 13A and 15A, in one embodiment, the openings 208 respectively extend from the corresponding conducting pads 206 into the corresponding predetermined scribe lines SC to connect with the formed recesses 208' and further extend towards the conducting pads 206 along another side of the predetermined scribe line SC to expose the conducting pads on the other side. That is, the opening 208 may extend across over the predetermined scribe line SC to connect with the recess 208' and extend to the conducting pad 206 in another die region to expose the conducting pads 206 in two adjacent die regions. In one embodiment, a width of the opening 208 is smaller than or equal to a width of the conducting pad 206. Because the opening 208 extends from the conducting pad 206 into the predetermined scribe line SC to connect with the recess 208' and extends to the conducting pad 206 on the other side, the aspect ratio of the opening 208 is thus reduced, which facilitates subsequent depositions of a variety of material layers in the opening 208.

Figure 14C:
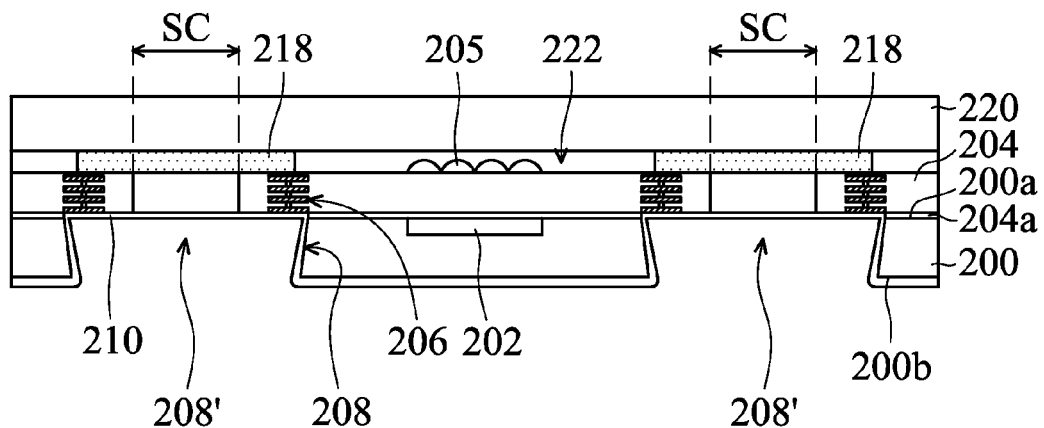

Next, as shown in FIG. 14C, an insulating layer 210 may be formed on the surface 200b of the substrate 200, which may extend into the openings 208. In one embodiment, the width of the opening 208 gradually increases along a direction extending from the surface 200b towards the conducting pad 206, and a thickness of the formed insulating layer 210 on the sidewall of the opening 208 may gradually decrease along a direction extending from the surface 200b towards the conducting pad 206. It is possible that because the portion of the opening 208 near the surface 200b has a smaller width, the insulating material used for forming the insulating layer 210 is blocked by the substrate 200 and can not easily enter the opening 208. Thus, the thickness of the insulating layer 210 on the sidewall of the opening 208 gradually decreases along a direction towards an inner portion of the opening.

Figure 14D:
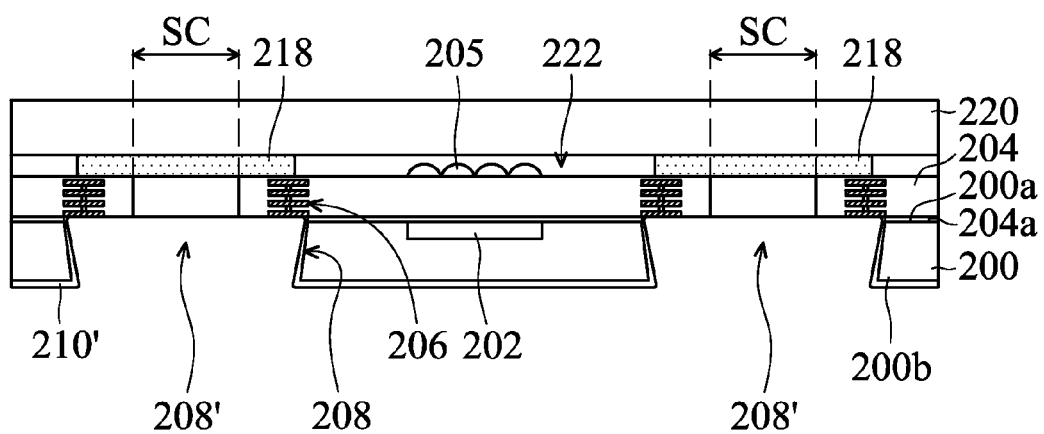

Then, as shown in FIG. 14D, in one embodiment, by using an etching process, a portion of the insulating layer 210 located on the bottom of the opening 208 may be removed to form a patterned insulating layer 210' such that the conducting pads 206 are exposed. In one embodiment, without using a patterned mask layer, the insulating layer on the surface 200b of the substrate 200 may be directly used as a mask, and an etching process is performed to the insulating layer 210 on the bottom of the opening 208 to form the patterned insulating layer 210', wherein the etching process is, for example, (but is not limited to) a dry etching process. In one embodiment, when the thinner insulating layer 210 on the bottom of the opening 208 is etched and removed, the insulating layer 210 on the sidewall of the opening 208 only becomes thinner and still partially remains on the sidewall of the opening 208 to be a portion of the patterned insulating layer 210'. In addition, because the thickness of the insulating layer 210 on the surface 200b is thicker, the insulating layer on the surface 200b of the substrate 200 only becomes thinner and still remains on the surface 200b of the substrate 200 to be a portion of the patterned insulating layer 210' when the insulating layer 210 on the bottom of the opening 208 is removed. As shown in FIG. 14D, in one embodiment, a thickness of a portion of the patterned insulating layer 210' extending on the sidewall of the opening 208 gradually decreases along a direction extending from the surface 200b towards the conducting pad 206.

In one embodiment, because no patterned mask layer is used during the formation of the patterned insulating layer 210', the insulating layer on the bottom of the opening 208 is substantially removed. In this case, it is preferable to use a structure having a special seal ring structure design to prevent the seal ring structure is exposed in the opening 208. For example, in one embodiment, the seal ring structure 207 as shown in FIG. 13A may be adopted. Thus, when wire layers are subsequently formed in the opening 208, the wire layers may be prevented from contacting with the seal ring structure to form a short circuiting. However, it should be appreciated that embodiments of the invention are not limited thereto. In another embodiment, the opening 208 may expose the seal ring structure. In this case, the wire layers may be prevented from contacting with the exposed seal ring structure through the control of the patterning process of the wire layers.

Figure 14E:
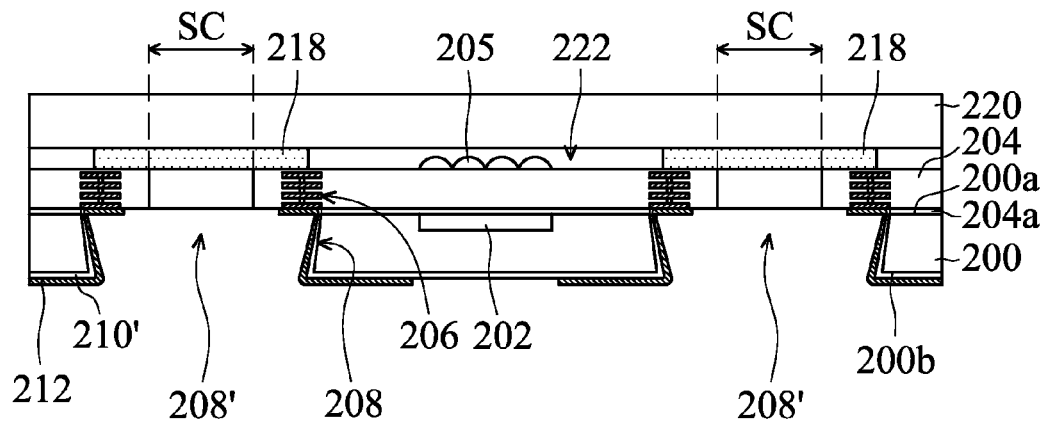

Next, as shown in FIG. 14E, a plurality of wire layers 212 are formed on the insulating layer 210 on the surface 200b of the substrate 200. Each of the wire layers 212 may extend from the surface 200b of the substrate 200 into the corresponding opening 208 to electrically contact with the corresponding conducting pad 206.

FIG. 15B is a three-dimensional view showing the structure corresponding to the structure shown in FIG. 14E. As shown in FIGS. 14E and 15B, the plurality of wire layers 212 extend from positions on the insulating layer 210' on the surface 200b of the substrate 200 into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212.

In addition, as shown in FIGS. 14E and 15B, the opening 208 does not expose the seal ring structure 207. The wire layers 212 formed in the openings 208 are not in contact with the seal ring structures 207. Thus, no short circuiting is formed between the wire layers 212. In this embodiment, because the opening 208 extends across over the predetermined scribe line SC and connects with the recess 208' to have a wider width, it is easier to form an insulating layer or a conducting layer in the opening 208. In addition, in this embodiment, the patterned insulating layer 210' may be formed directly by using an etching process, processes such as an exposure process, development process, removing process of a patterned mask layer may not be needed. Fabrication time and cost may be reduced.

Figure 14F:
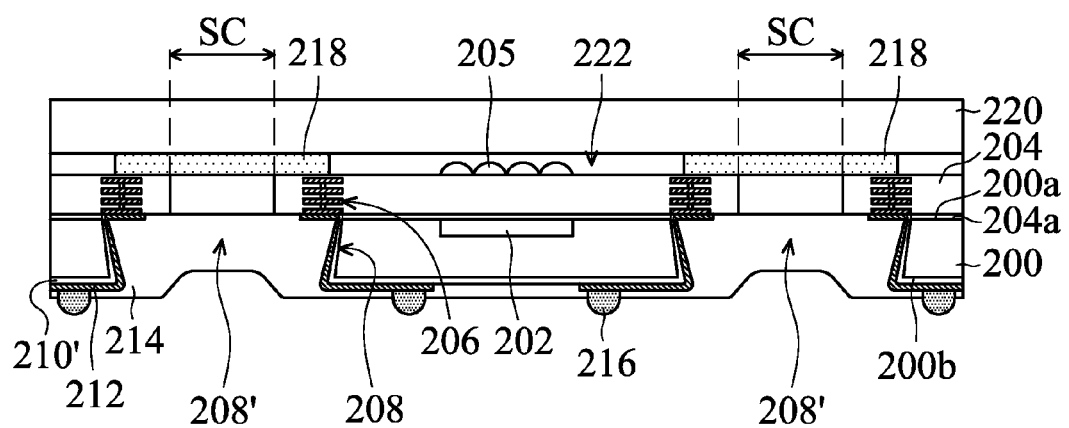

Next, as shown in FIG. 14F, a protection layer 214 is formed on the surface 200b of the substrate 200. The protection layer 214 may cover the substrate 200, the wire layers 212, and the openings 208. Then, the protection layer 214 may be patterned to have openings exposing a portion of the wire layers 212. Then, conducting bumps 216 may be formed on the exposed wire layers 212, which may be, for example, solder balls.

Figure 14G:
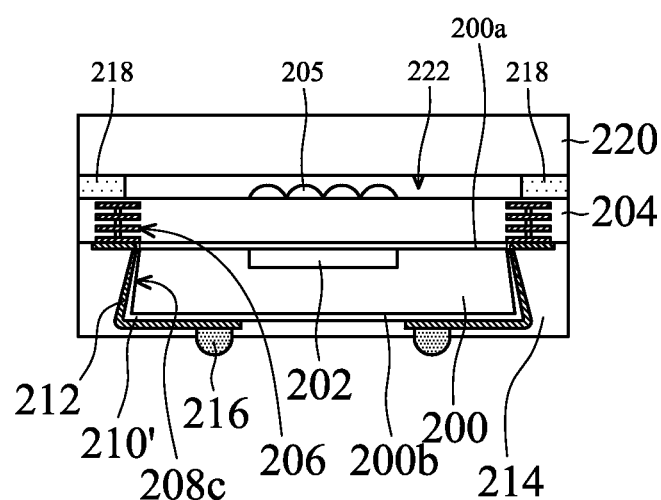

Next, a dicing process may be performed along the predetermined scribe lines SC to form a plurality of chip packages separated from each other. FIG. 14G is a cross-sectional view showing one of the chip packages, and FIGS. 13B and 15C respectively show a plane view and a three-dimensional view of the structure corresponding to the structure shown in FIG. 14G. After the dicing process is performed, a portion of the opening 208 becomes an opening 208c located at a side surface 200c of the substrate of the chip package, as shown in FIG. 13B or FIG. 15C.

As shown in FIGS. 14G, 13B, and 15C, the chip package of the embodiment may be substantially similar to the chip package of the embodiment shown in FIGS. 2F, 3B, and 4C, wherein one of the main differences is that the wide of the opening 208c gradually increases along a direction extending from the surface 200b towards the conducting pad 206. In one embodiment, the openings 208c exposes the corresponding conducting pad 206 and extends towards the side surface 200c of the substrate 200 along a direction intersecting the side surface 200c of the substrate 200 to extend beyond the conducing pads 206. In one embodiment, the opening 208c extends to the side surface 200c of the substrate 200, as shown in FIG. 15C.

FIGS. 16A-16F are cross-sectional views showing the steps of forming a chip package according to an embodiment of the present invention. FIGS. 17A-17C are three-dimensional views showing the steps of forming a chip package corresponding to the embodiment shown in FIG. 16. In the embodiment shown in FIGS. 16-17, same or similar reference numbers are used to designate same or similar elements.

Figure 16A:
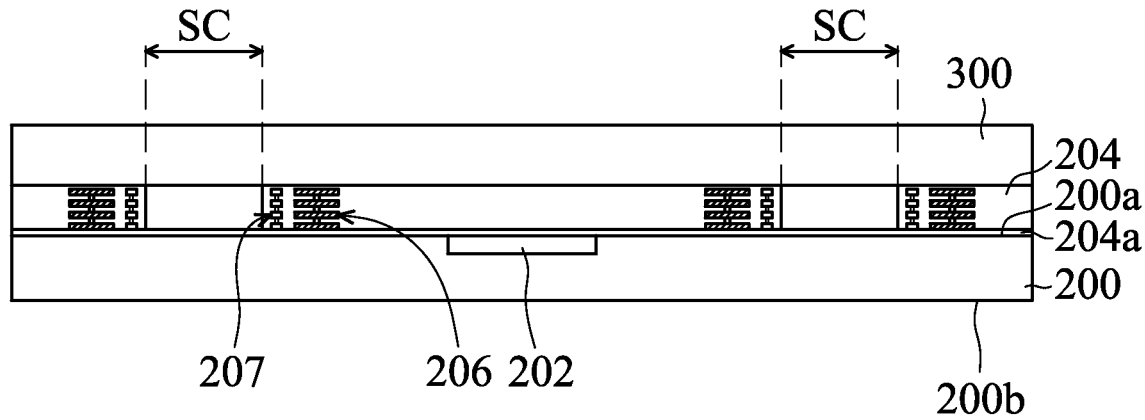
FIGS. 16A-16F are cross-sectional views showing the steps of forming a chip package according to an embodiment of the present invention.
Figure 17A:
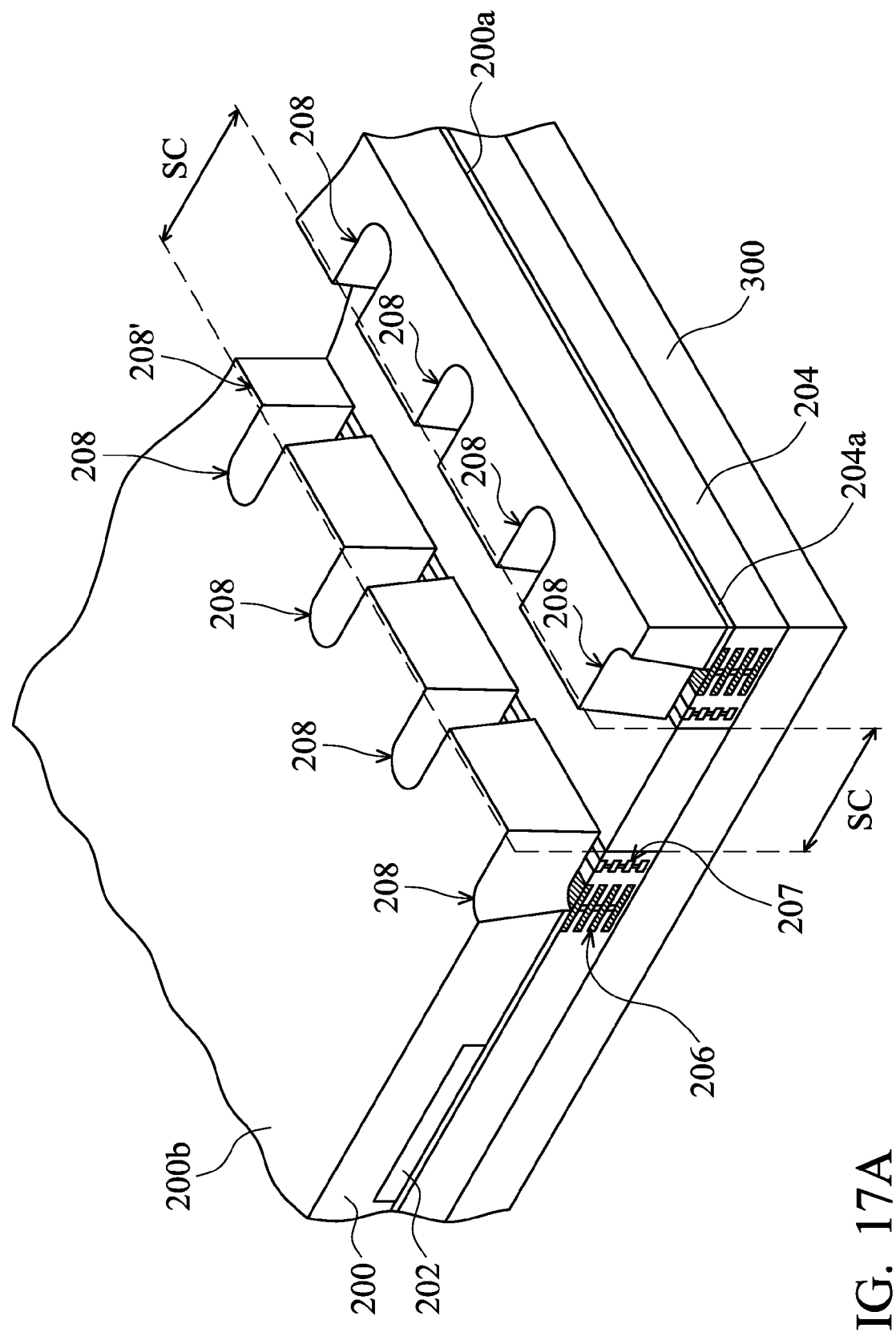
FIGS. 17A-17C are three-dimensional views showing the steps of forming a chip package according to an embodiment of the present invention.
Figure 17B:
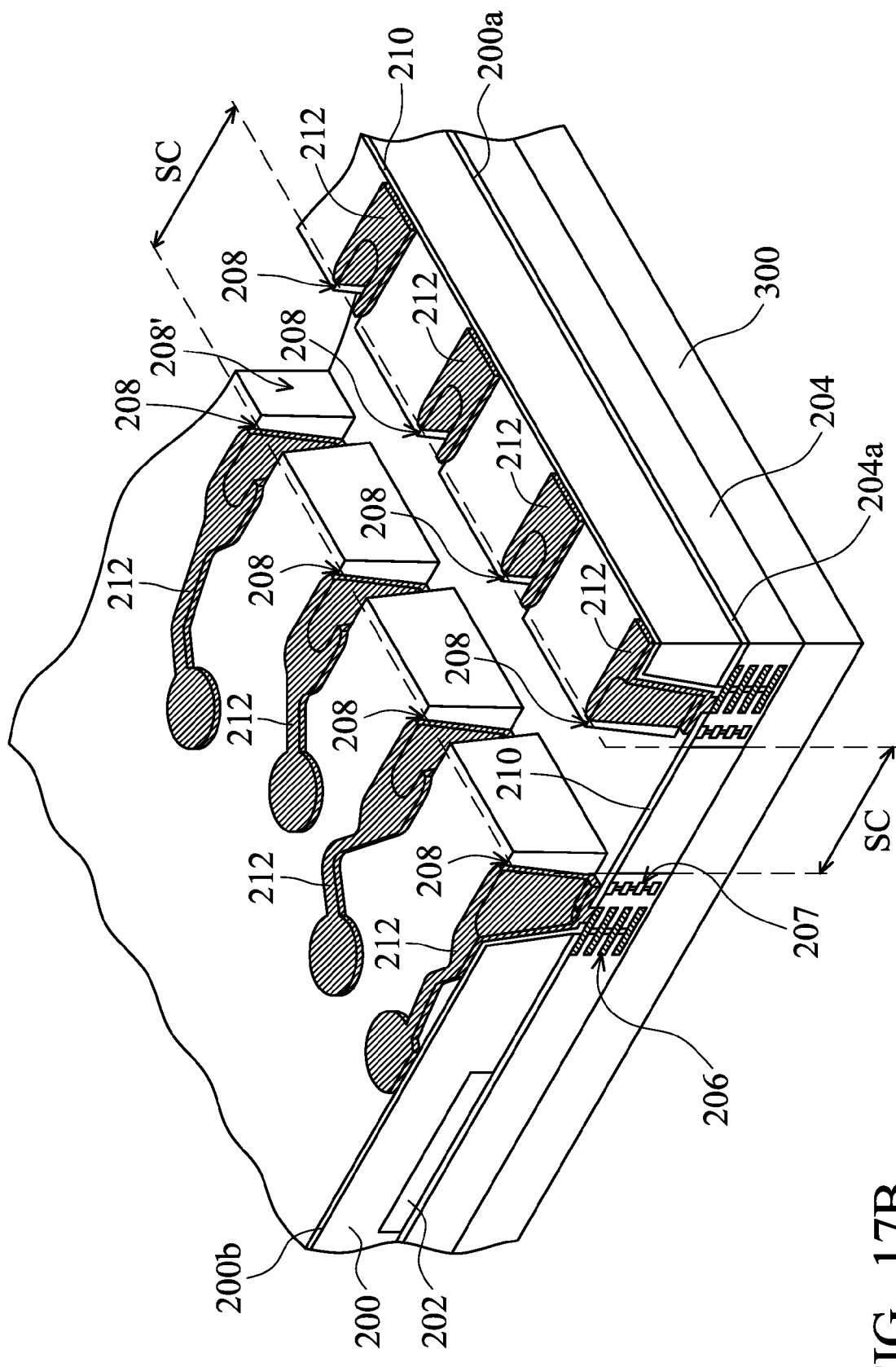
Figure 17C:
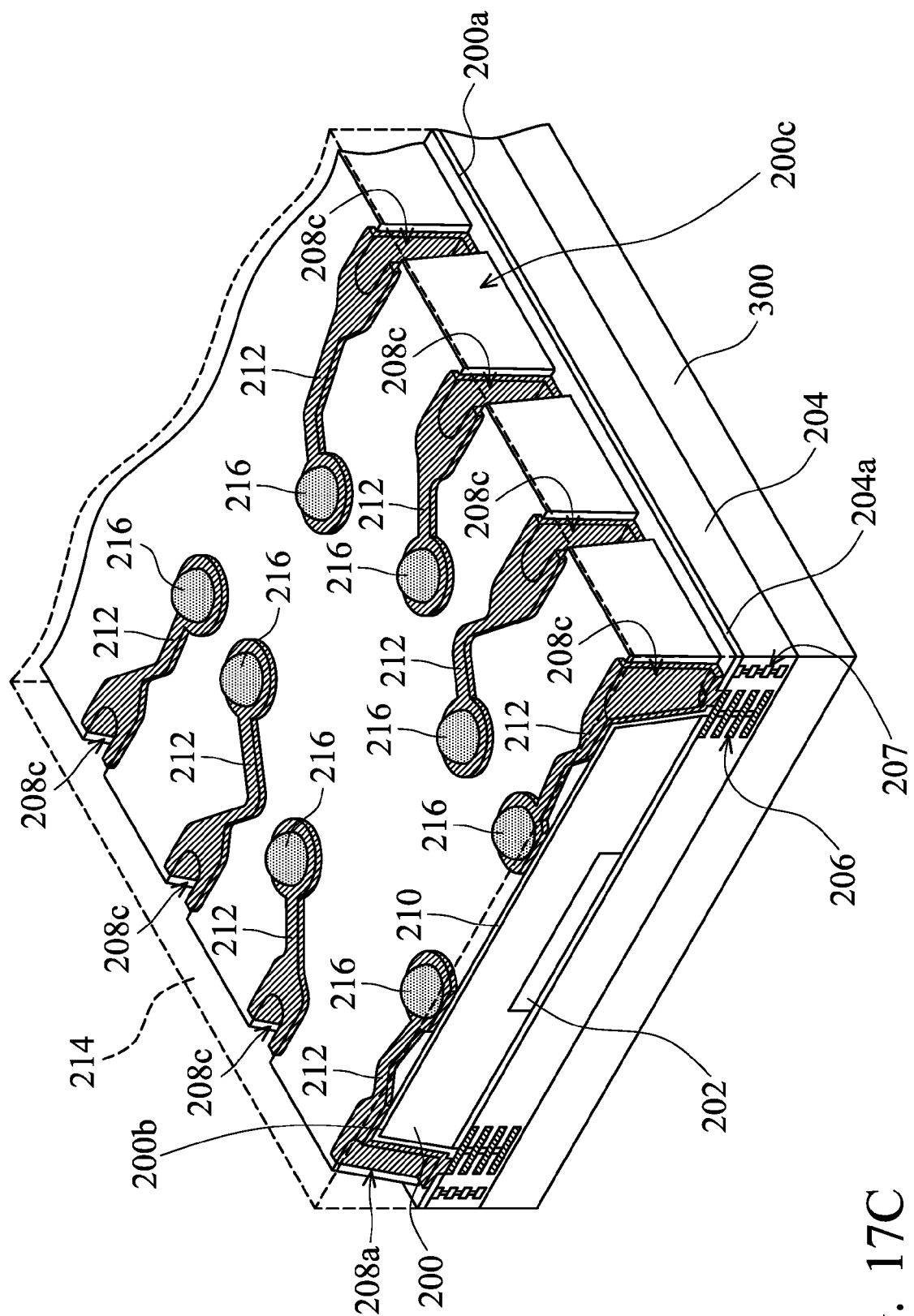

As shown in FIG. 16A, in one embodiment, a substrate 200 similar to that shown in FIG. 2A is provided. In one embodiment, device regions 202 may be formed in the substrate 200. The device region 202 may include opto electronic devices, micro electro mechanical systems (MEMS), micro fluidic systems, and physical sensors for detecting heat, light, or pressure, or power MOSFET modules. A dielectric layers 204a and 204, conducting pads 206, and seal ring structures 207 may be disposed on the surface 200a of the substrate 200. A plurality of predetermined scribe lines SC define the substrate 200 into a plurality of die regions. After a subsequent dicing process is performed along the predetermined scribe lines SC, each die region becomes the chip in the formed chip package.

In this embodiment, no spacer layer, microlens, and cover layer is disposed on the dielectric layer 204. In one embodiment, a carrier substrate 300 may be optionally disposed on the dielectric layer 204 on the surface 200a of the substrate 200. In one embodiment, the carrier substrate 300 is a substrate which can be easily removed in a subsequent process. The carrier substrate 300 may include, for example, a silicon substrate, glass substrate, ceramic substrate, polymer substrate, or combinations thereof. The carrier substrate 300 may be bonded onto the dielectric layer 204 through an adhesion layer (not shown). In one embodiment, the adhesion layer is capable of being easily removed such that the carrier substrate 300 may also be together removed from the surface 200a of the substrate 200. For example, the used adhesion layer may lose stickiness when being irradiated with specific light, dipped in specific solution, or kept in specific temperature, such that the carrier substrate 300 may be easily removed. In another embodiment, the carrier substrate 300 may not be disposed, and subsequent processes are directly performed. In this case, a UV tape may be attached onto the substrate 200 or the dielectric layer 204 to fix the substrate 200 to facilitate proceeding of the subsequent processes.

Figure 16B:
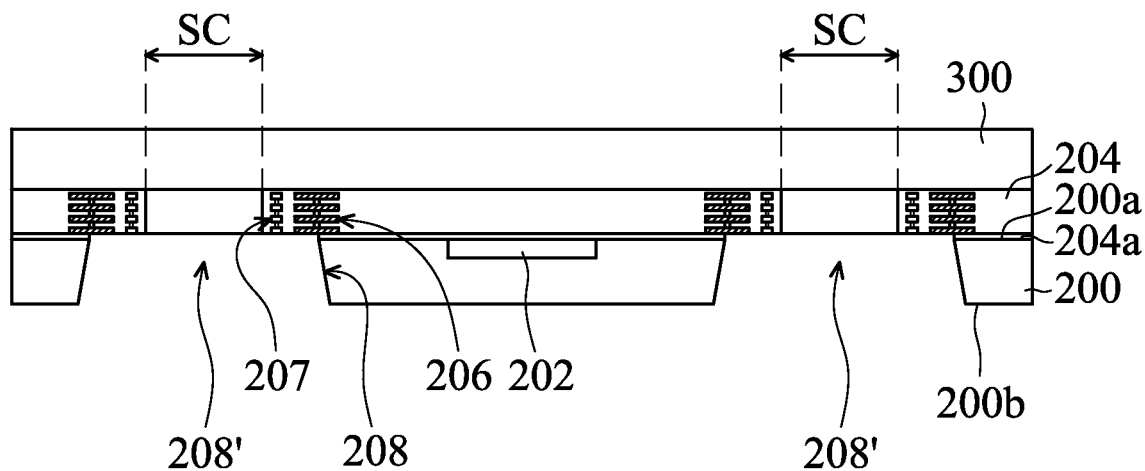

Next, as shown in FIG. 16B, through, for example, a photolithography process and an etching process, a portion of the substrate 200 is removed to form a plurality of openings 208 extending from the surface 200b towards the surface 200a of the substrate 200. Then, a portion of the dielectric layer 204a may be further removed to expose the conducting pads 206. In one embodiment, the openings 208 may expose the conducting pads 206 and the seal ring structures 207, respectively and correspondingly.

In one embodiment, by using, for example, a photolithography process and an etching process, a portion of the substrate 200 may be optionally removed to form a plurality of recesses 208' (which is, for example, trenches) extending from the surface 200b towards the surface 200a of the substrate 200. The recesses 208' may connect with the openings 208 mentioned above. In one embodiment, the openings 208 and the recesses 208' may be formed in a same patterning process.

FIG. 17A is a three-dimensional view showing the structure corresponding to that shown in FIG. 16B. As shown in FIGS. 17A and 16B, in one embodiment, the openings 208 respectively extend from the corresponding conducting pads 206 into the corresponding predetermined scribe lines SC to connect with the formed recesses 208' and further extend towards the conducting pads along another side of the predetermined scribe line SC to expose the conducting pads on the other side. That is, the opening 208 may extend across over the predetermined scribe line SC to connect with the recess 208' and extend to the conducting pad 206 in another die region to expose the conducting pads 206 in two adjacent die regions.

Figure 16C:
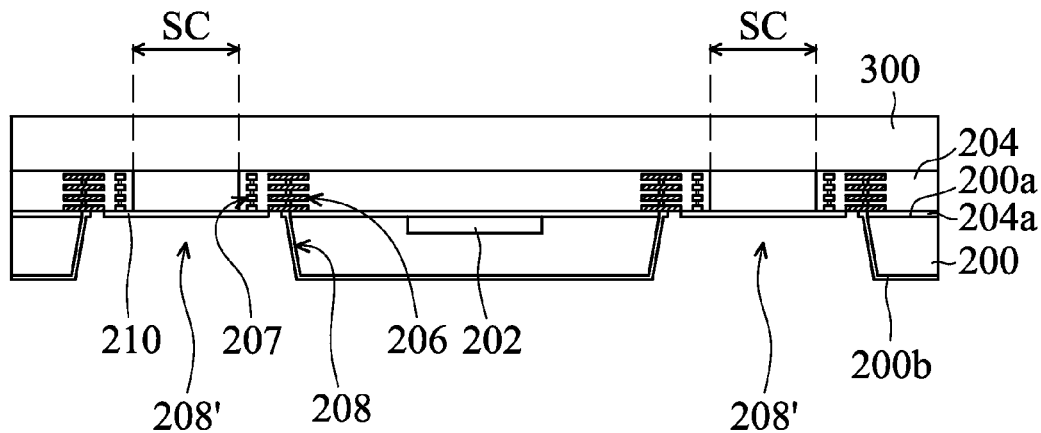

Next, as shown in FIG. 16C, an insulating layer 210 may be formed on the surface 200b of the substrate 200, which may extend into the openings 208. Then, by using a photolithography process and an etching process, a portion of the insulating layer 210 located on the bottom of the opening 208 may be removed to expose the conducting pad 206. In one embodiment, it is preferable that the insulating layer 210 still completely covers the seal ring structures 207 to prevent subsequently formed wire layers from contacting with the seal ring structures 207 and causing a short circuiting.

Figure 16D:
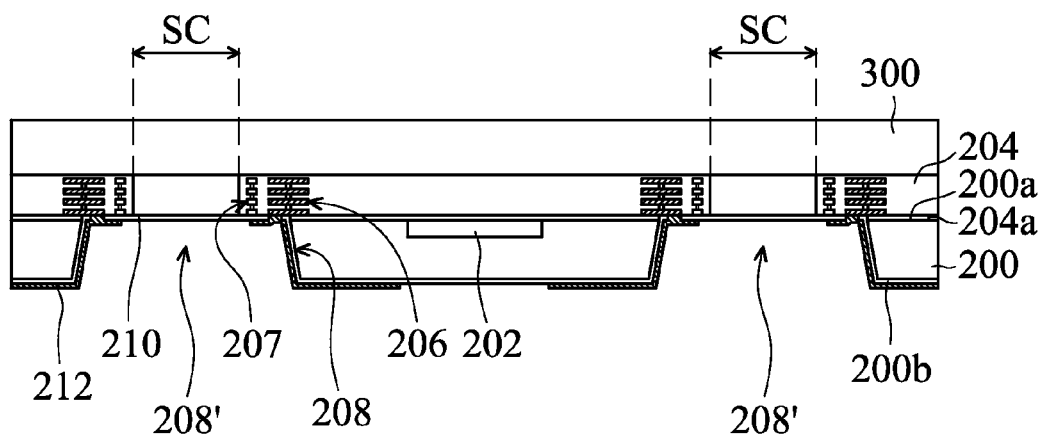

As shown in FIG. 16D, a plurality of wire layers 212 are then formed on the insulating layer 210 on the surface 200b of the substrate 200. Each of the wire layers 212 may extend from the surface 200b of the substrate 200 into the corresponding opening 208 to electrically contact with the corresponding conducting pad 206.

FIG. 17B is a three-dimensional view showing the structure corresponding to the structure shown in FIG. 16D. As shown in FIGS. 16D and 17B, the plurality of wire layers 212 extend from positions on the insulating layer 210 on the surface 200b of the substrate 200 into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212. In addition, the wire layers 212 are separated from the seal ring structures 217 by the insulating layer 210 such that no short circuiting forms between the wire layers 212. In this embodiment, because the opening 208 extends across over the predetermined scribe line SC and connects with the recess 208' to have a wider width, it is easier to form an insulating layer or a conducting layer in the opening 208.

Figure 16E:
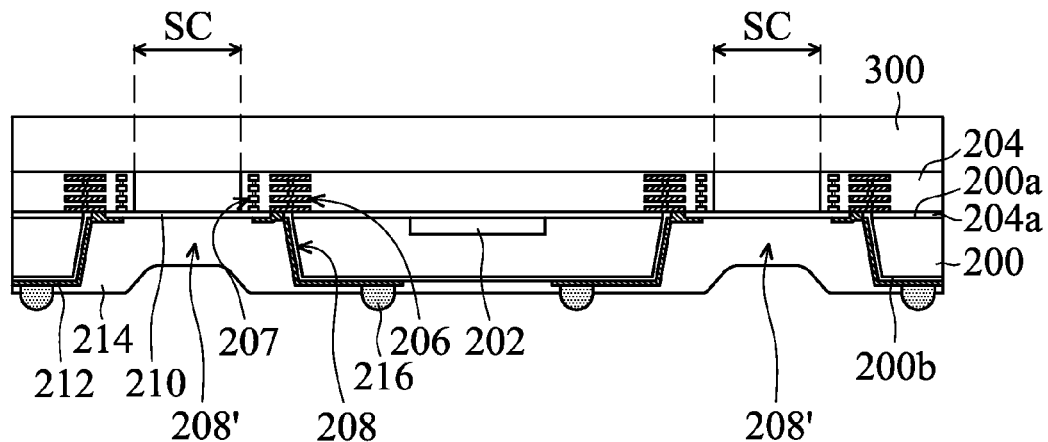

Next, as shown in FIG. 16E, a protection layer 214 is formed on the surface 200b of the substrate 200. The protection layer 214 may cover the substrate 200, the wire layers 212, and the openings 208. Then, the protection layer 214 may be patterned to have openings exposing a portion of the wire layers 212. Then, conducting bumps 216 may be formed on the exposed wire layers 212, which may be, for example, solder balls.

Figure 16F:
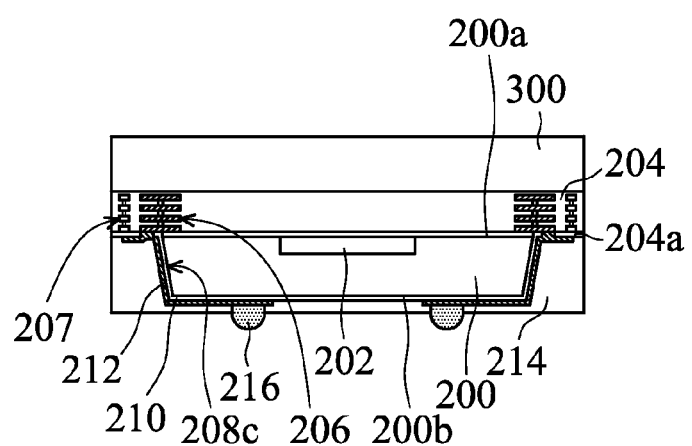

Next, a dicing process may be performed along the predetermined scribe lines SC to form a plurality of chip packages separated from each other. FIG. 16F is a cross-sectional view showing one of the chip packages, and FIG. 17C shows a three-dimensional view of the structure corresponding to the structure shown in FIG. 16F. In another embodiment, an edge of the protection layer 214 of the chip package may also not be coplanar with edges of the chip and/or the dielectric layer 204, and a distance d (not shown) is therebetween. After the dicing process is performed, a portion of the opening 208 becomes an opening 208c located at a side surface 200c of the substrate of the chip package.

As shown in FIGS. 16F and 17C, the chip package of the embodiment may be substantially similar to the chip package of the embodiment shown in FIGS. 2F, 3B, and 4C, wherein the main difference is that this embodiment has no spacer layer, cover layer, and microlens. In one embodiment, the openings 208c exposes the corresponding conducting pad 206 and extends towards the side surface 200c of the substrate 200 along a direction intersecting the side surface 200c of the substrate 200 to extend beyond the conducing pads 206. In one embodiment, the opening 208c extends to the side surface 200c of the substrate 200, as shown in FIG. 17C.

In addition, in one embodiment, the chip package may have the carrier substrate 300 or may have no carrier substrate 300. In one embodiment, the carrier substrate 300 may be removed before the dicing process is performed. Alternatively, in another embodiment, no carrier substrate has been disposed on the dielectric layer 204.

Figure 18A:
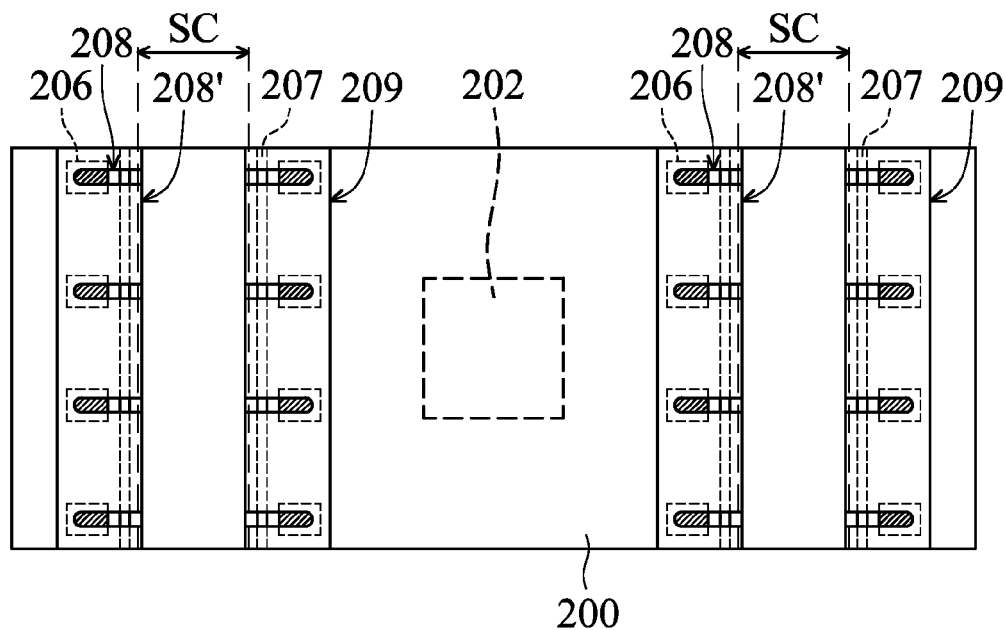
FIGS. 18A-18B are plane views showing the steps of forming a chip package according to an embodiment of the present invention.
Figure 18B:
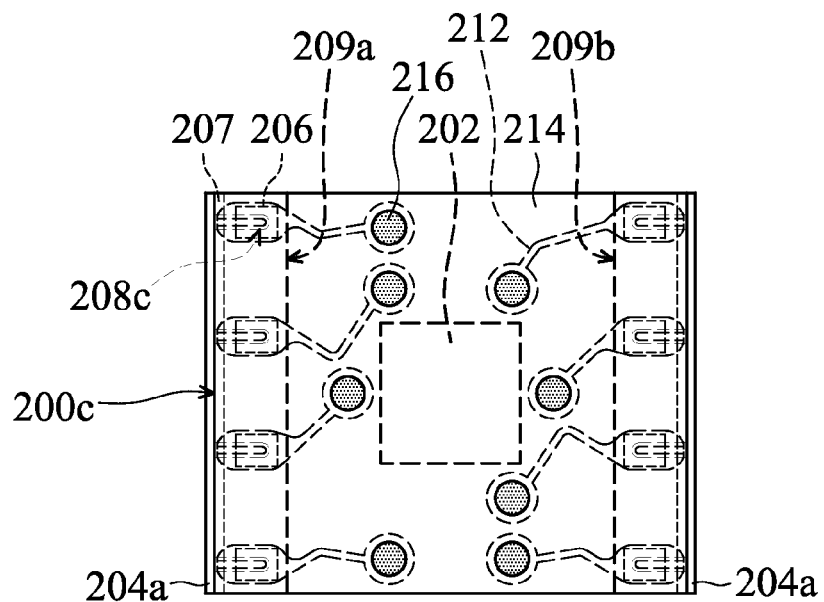

FIGS. 18A-18B are plane views showing the steps of forming a chip package according to an embodiment of the present invention. FIGS. 19A-19F are cross-sectional views showing the steps of forming a chip package corresponding to the embodiment shown in FIG. 18. FIGS. 20A-20C are three-dimensional views showing the steps of forming a chip package corresponding to the embodiment shown in FIG. 18. In the embodiment shown in FIGS. 18-20, same or similar reference numbers are used to designate same or similar elements.

Figure 19A:
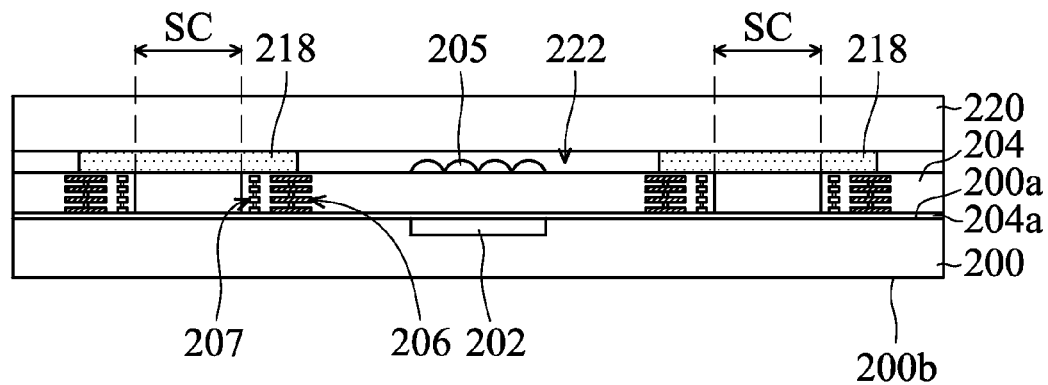
FIGS. 19A-19F are cross-sectional views showing the steps of forming a chip package according to an embodiment of the present invention.
Figure 19B:
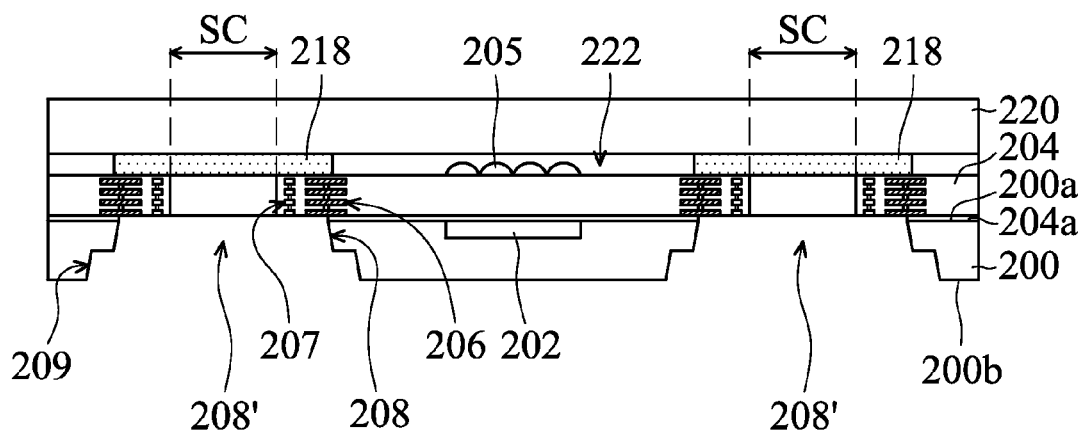
Figure 20A:
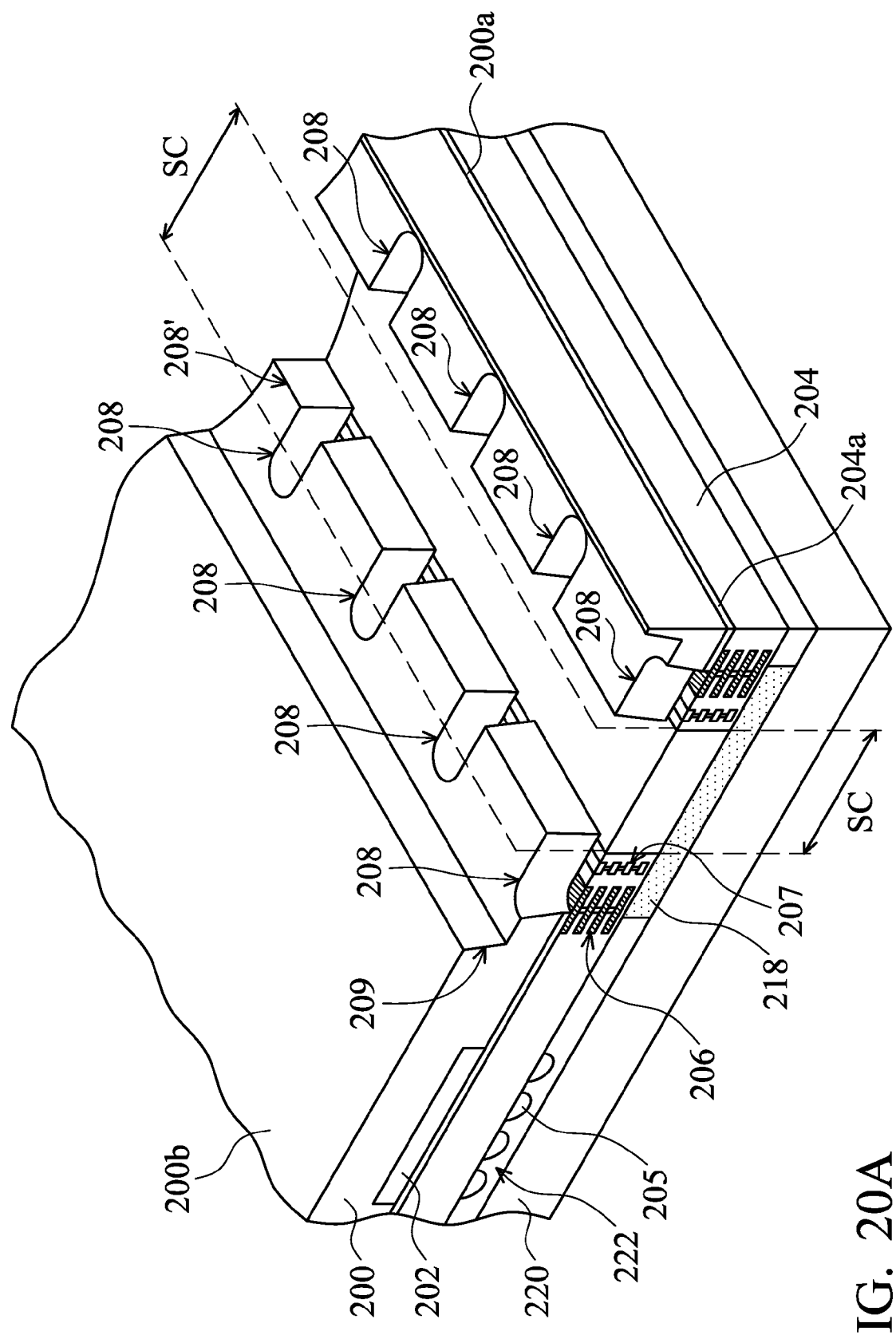
FIGS. 20A-20C are three-dimensional views showing the steps of forming a chip package according to an embodiment of the present invention.
Figure 20B:
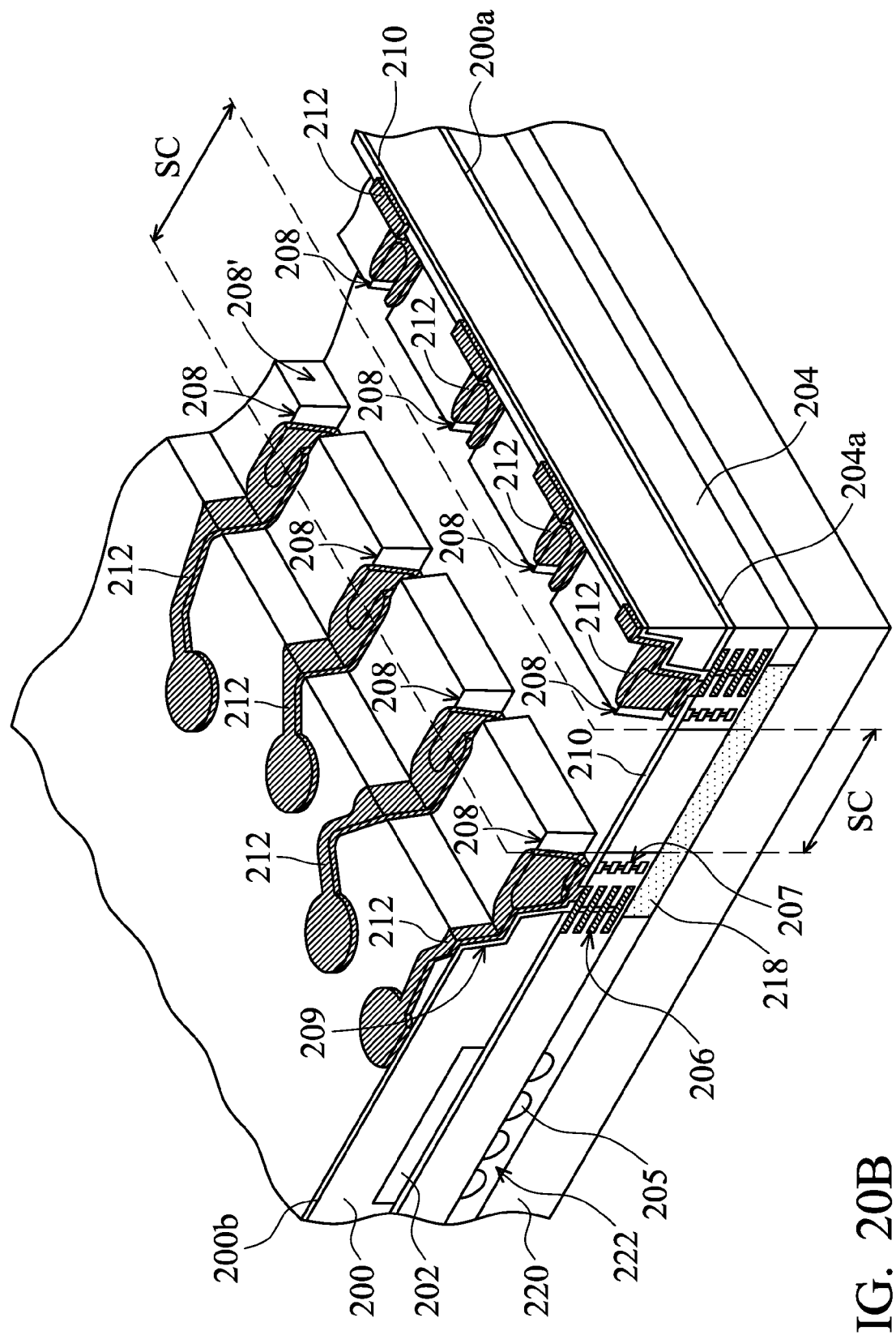
Figure 20C:
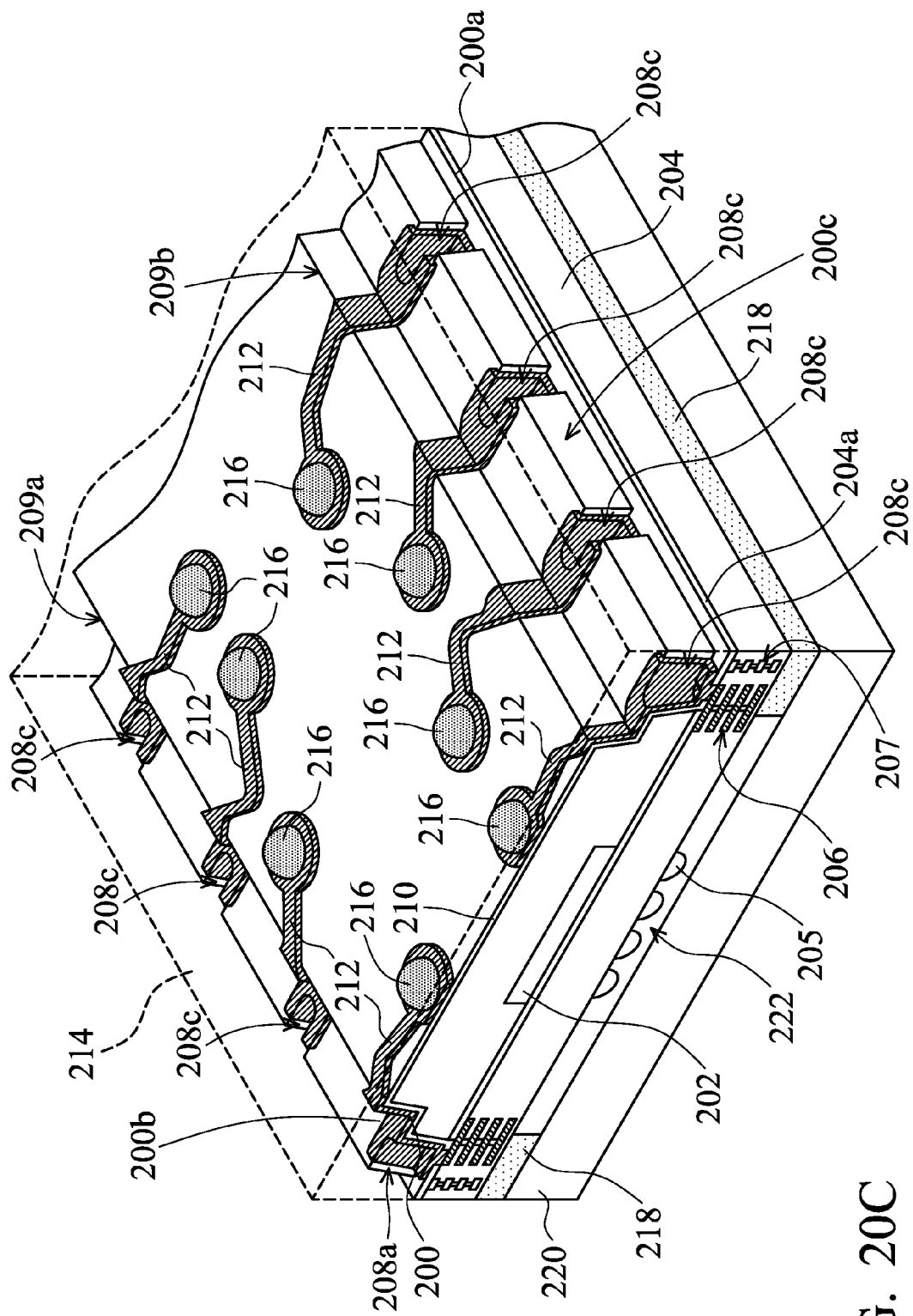

As shown in FIG. 19A, in one embodiment, a structure similar to that shown in FIG. 2A is provided. Next, as shown in FIG. 19B, through, for example, a photolithography process and an etching process, a portion of the substrate 200 is removed to form a plurality of recesses 209 extending from the surface 200b towards the surface 200a of the substrate 200. The recesses 209 may be, for example, trenches which may overlap the predetermined scribe lines SC. In one embodiment, a bottom of the recess 209 is the substantially planar substrate 200.

As shown in FIG. 19B, after the recesses 209 are formed, a portion of the substrate 200 may then be removed by using, for example, a photolithography process and an etching process to form a plurality of opening 208 extending from the bottoms of the recesses 209 towards the surface 200a. Because the opening 208 is formed from a surface of the substrate 200 at the bottom of the recess 209, the formed opening 208 has a smaller depth contributing to a smaller aspect ratio, which facilitates the proceeding of subsequent processes.

Then, a portion of the dielectric layer 204a may be further removed to expose the conducting pads 206. In one embodiment, the openings 208 may expose the conducting pads 206 and the seal ring structures 207, respectively and correspondingly. In one embodiment, by using, for example, a photolithography process and an etching process, a portion of the substrate 200 may be optionally removed to form a plurality of recesses 208' (which is, for example, trenches) extending from the surface 200b towards the surface 200a of the substrate 200. The recesses 208' may connect with the openings 208 mentioned above. In one embodiment, the openings 208 and the recesses 208' may be formed in a same patterning process.

FIGS. 18A and 20A are a plane view and a three-dimensional view showing the structure corresponding to that shown in FIG. 19B, respectively. As shown in FIGS. 18A and 20A, in one embodiment, the openings 208 respectively extend from the corresponding conducting pads 206 into the corresponding predetermined scribe lines SC to connect with the formed recesses 208' and further extend towards the conducting pads along another side of the predetermined scribe line SC to expose the conducting pads on the other side. That is, the opening 208 may extend across over the predetermined scribe line SC to connect with the recess 208' and extend to the conducting pad 206 in another die region to expose the conducting pads 206 in two adjacent die regions. In addition, the openings 208 further connect with the recesses 209 such that subsequent deposition of material layers (such as an insulating layer and wire layers) is easier.

Figure 19C:
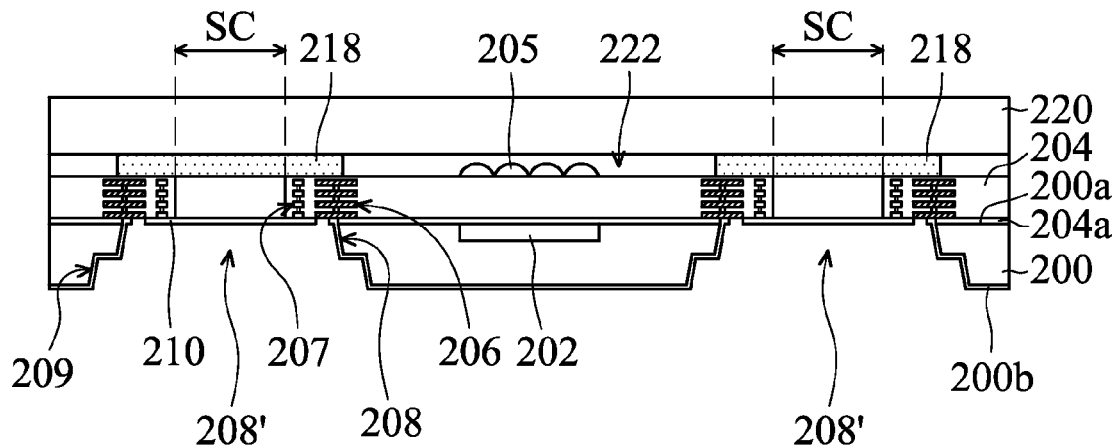

Next, as shown in FIG. 19C, an insulating layer 210 may be formed on the surface 200b of the substrate 200, which may extend onto sidewalls of the recesses 209 and the openings 208. Then, by using a photolithography process and an etching process, a portion of the insulating layer 210 located on the bottom of the opening 208 may be removed to expose the conducting pad 206. In one embodiment, it is preferable that the insulating layer 210 still completely covers the seal ring structures 207 to prevent subsequently formed wire layers from contacting with the seal ring structures 207 and causing a short circuiting.

Figure 19D:
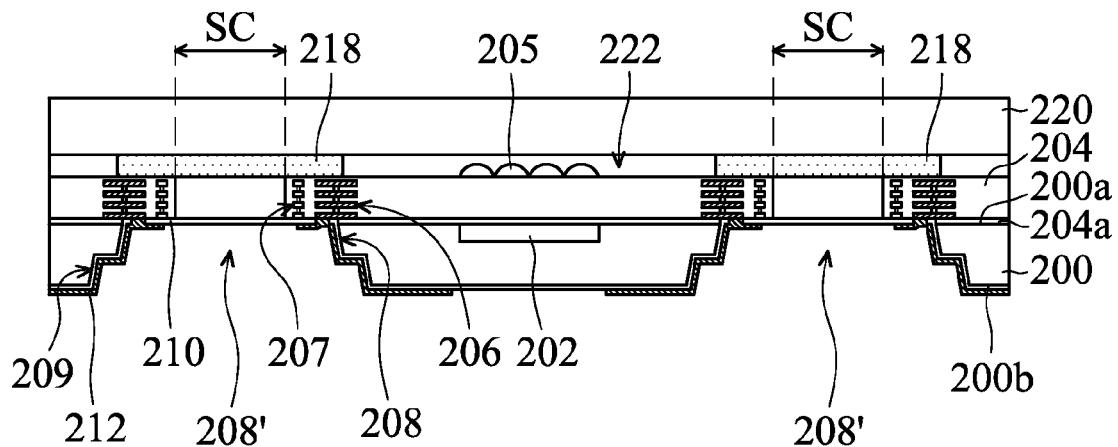

As shown in FIG. 19D, a plurality of wire layers 212 are then formed on the insulating layer 210 on the surface 200b of the substrate 200. Each of the wire layers 212 may extend from the surface 200b of the substrate 200 into the corresponding opening 208 to electrically contact with the corresponding conducting pad 206.

FIG. 20B is a three-dimensional view showing the structure corresponding to the structure shown in FIG. 19D. As shown in FIGS. 19D and 20B, the plurality of wire layers 212 extend from positions on the insulating layer 210 on the surface 200b of the substrate 200 into the recesses 209 and further extend into the openings 208, respectively and correspondingly, to electrically contact with the corresponding conducting pads 206 below the corresponding openings 208. In one embodiment, each of the wire layers 212 does not extend into the predetermined scribe lines SC or is separated from the predetermined scribe line SC by a distance. Thus, when a dicing process is subsequently performed along the predetermined scribe lines SC, a cutting blade is not in contact with the wire layers 212 to cause damage or peeling of the wire layers 212. In addition, the wire layers 212 are separated from the seal ring structures 217 by the insulating layer 210 such that no short circuiting forms between the wire layers 212. In this embodiment, because the opening 208 connects with the recess 209 and extends across over the predetermined scribe line SC to connect with the recess 208' to have a wider width, it is easier to form an insulating layer or a conducting layer in the opening 208.

Figure 19E:
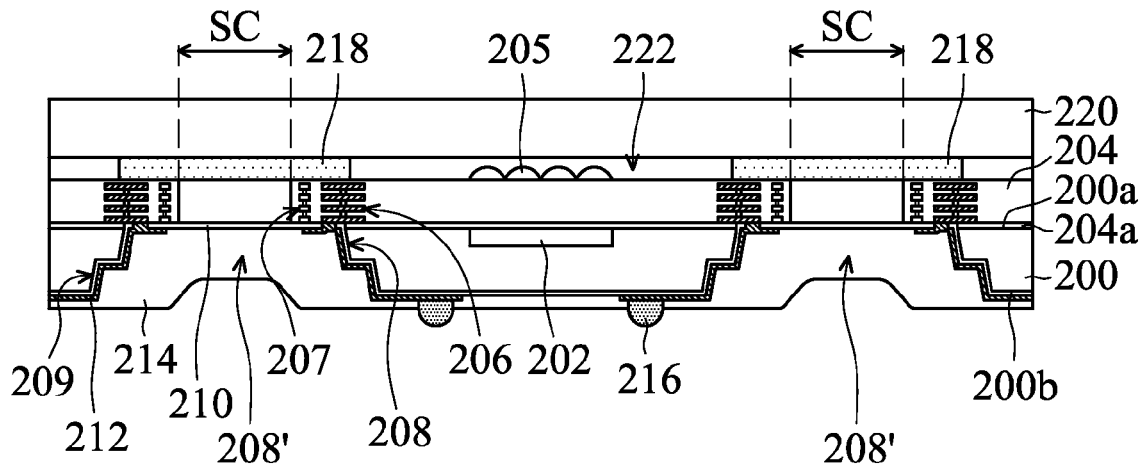

Next, as shown in FIG. 19E, a protection layer 214 is formed on the surface 200b of the substrate 200. The protection layer 214 may cover the substrate 200, the wire layers 212, and the openings 208. Then, the protection layer 214 may be patterned to have openings exposing a portion of the wire layers 212. Then, conducting bumps 216 may be formed on the exposed wire layers 212, which may be, for example, solder balls.

Figure 19F:
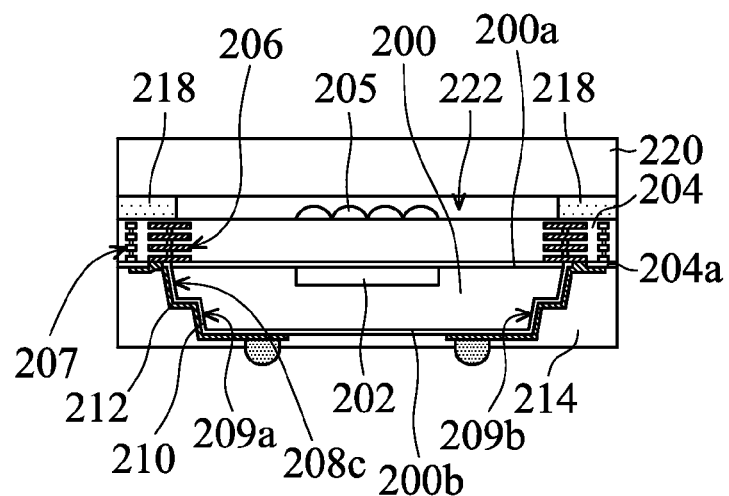

Next, a dicing process may be performed along the predetermined scribe lines SC to form a plurality of chip packages separated from each other. FIG. 19F is a cross-sectional view showing one of the chip packages, and FIGS. 18B and 20C respectively show a plane view and a three-dimensional view of the structure corresponding to the structure shown in FIG. 19F. In one embodiment, an edge of the protection layer 214 may be set to be not coplanar with edges of the chip and/or the dielectric layer 204 and a distance is therebetween (not shown). After the dicing process is performed, a portion of the opening 208 becomes an opening 208c located at a side surface 200c of the substrate of the chip package, and a portion of the recess 209 become a recess 209a or 209b located at an edge of the substrate of the chip package, as shown in FIG. 18B or FIG. 20C.

As shown in FIGS. 19F, 18B, and 20C, the chip package of the embodiment may be substantially similar to the chip package of the embodiment shown in FIGS. 2F, 3B, and 4C, wherein the main difference is that the chip package of this embodiment further include the recess 209a and/or the recess 209b. In one embodiment, the openings 208c exposes the corresponding conducting pad 206 and extends towards the side surface 200c of the substrate 200 along a direction intersecting the side surface 200c of the substrate 200 to extend beyond the conducing pads 206. In one embodiment, the opening 208c extends to the side surface 200c of the substrate 200, as shown in FIG. 20C.

The packaging technique of the embodiments of the invention may effectively reduce the process difficulty of forming the wire layer electrically connected to the conducting pad in the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface, an opposite second surface, and a side surface connecting the first surface and the second surface;
   a dielectric layer located on the first surface of the substrate;
   a plurality of conducting pads at least comprising a first conducting pad and a second conducting pad located in the dielectric layer;
   a plurality of openings extending from the second surface towards the first surface of the substrate and respectively and correspondingly exposing the conducting pads, wherein at least a first opening of the openings and at least a second opening of the openings adjacent to the first opening respectively expose the first conducting pad and the second conducting pad and extend towards the side surface of the substrate to extend beyond the first conducting pad and the second conducting pad in a direction of a normal vector of the side surface;
   a first wire layer and a second wire layer located on the second surface of the substrate and extend into the first opening and the second opening to electrically connect to the first conducting pad and the second conducting pad, respectively; and
   a seal ring structure disposed in the dielectric layer, wherein the seal ring structure comprises a plurality of separate seal rings respectively disposed along a periphery of the substrate and located outside of projection regions of the first opening and the second opening on the dielectric layer.

2. The chip package as claimed in claim 1, wherein the first opening and the second opening are between the first conducting pad, the second conducting pad, and the side surface of the substrate, respectively.

3. The chip package as claimed in claim 2, wherein the first opening and the second opening connect the side surface of the substrate, respectively.

4. The chip package as claimed in claim 3, wherein the first opening and the second opening respectively extend along a direction parallel to the side surface of the substrate and do not extend beyond the first conducting pad and the second conducting pad in the direction parallel to the side surface, respectively.

5. The chip package as claimed in claim 1, wherein the first opening is separated from the second opening by the substrate.

6. The chip package as claimed in claim 5, wherein the conducting pads are separated from the side surface of the substrate by a distance.

7. The chip package as claimed in claim 1, further comprising a protection layer covering the substrate, the first wire layer, the second wire layer, the first opening, and the second opening.

8. The chip package as claimed in claim 7, wherein the protection layer retreats from the side surface of the substrate and is separated from the side surface of the substrate by a distance.

9. The chip package as claimed in claim 7, further comprising a first conducting bump and a second conducting bump penetrating the protection layer and electrically contacting with the first wire layer and the second wire layer, respectively.

10. The chip package as claimed in claim 1, wherein the first opening and the second opening respectively have an opening end located at the first surface, and a width of the opening end is smaller than or equals to a width of the first conducting pad.

11. The chip package as claimed in claim 1, wherein the first wire layer in the first opening is not coplanar with the side surface of the substrate and is separated from the side surface by a distance.

12. The chip package as claimed in claim 1, wherein the first opening has a long axis direction connecting and perpendicular to the side surface of the substrate.

13. The chip package as claimed in claim 1, wherein a sidewall of the first opening intersects the side surface of the substrate, an angle is between the sidewall of the opening and the side surface of the substrate, and the angle is less than 90 degree.

14. The chip package as claimed in claim 1, wherein a width of the first opening decreases along a direction extending from the second surface towards the first surface.

15. The chip package as claimed in claim 1, further comprising a seal ring structure disposed in the dielectric layer and surrounding the conducting pads along a periphery of the substrate.

16. The chip package as claimed in claim 1, wherein a width of the first opening increases along a direction extending from the second surface towards the first surface.

17. The chip package as claimed in claim 1, wherein a contact surface of the first wire layer and the first conducting pad is separated from the side surface of the substrate by a distance.

18. The chip package as claimed in claim 1, further comprising a second substrate disposed on the dielectric layer on the first surface of the substrate.

19. The chip package as claimed in claim 1, further comprising a recess extending from the second surface towards the first surface of the substrate and connecting the first opening and the second opening.

20. A chip package, comprising:
   a substrate have a first surface, an opposite second surface, and a side surface extending between the first surface and the second surface;
   a dielectric layer located on the first surface of the substrate;
   a plurality of conducting pads disposed in the dielectric layer above the first surface;
   a plurality of open channels defined on the side surface, extending from the second surface to the first surface and exposing the conducting pads at the first surface;
   a wire layer disposed above the second surface and extending into the open channels to electrically contact the conducting pads; and
   a seal ring structure disposed in the dielectric layer, wherein the seal ring structure comprises a plurality of separate seal rings respectively disposed along a periphery of the substrate and located outside of projection regions of the open channels on the dielectric layer.

21. The chip package as claimed in claim 20, wherein the side surface defines a perimeter of the substrate that is beyond the conducting pads above the first surface.

22. The chip package as claimed in claim 20, wherein the conducting pads do not extend to the open channels and the side surface.

* * * * *